US006608612B2

(12) United States Patent
Kokubun et al.

(10) Patent No.: US 6,608,612 B2
(45) Date of Patent: *Aug. 19, 2003

(54) SELECTOR AND MULTILAYER INTERCONNECTION WITH REDUCED OCCUPIED AREA ON SUBSTRATE

(75) Inventors: Masatoshi Kokubun, Kawasaki (JP); Shinya Udo, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/441,134

(22) Filed: Nov. 17, 1999

(65) Prior Publication Data

US 2003/0071777 A1 Apr. 17, 2003

(30) Foreign Application Priority Data

Nov. 20, 1998 (JP) ............................................ 10-330507
Nov. 20, 1998 (JP) ............................................ 10-331695

(51) Int. Cl.[7] ................................................. G09G 3/36
(52) U.S. Cl. ........................................ 345/98; 341/144
(58) Field of Search ................................ 345/210–212, 345/87, 94, 95; 341/136, 141, 144, 145, 148; 348/572, 573

(56) References Cited

U.S. PATENT DOCUMENTS 4,146,882 A * 3/1979 Hoff, Jr. et al. ............. 341/138
4,281,319 A * 7/1981 Roberts, Jr. ................. 341/136
5,065,159 A * 11/1991 Kuwana ...................... 341/148
6,160,533 A * 12/2000 Tamai et al. .................. 345/89

FOREIGN PATENT DOCUMENTS

JP              3218052           9/1991

OTHER PUBLICATIONS

Hans–Peter Messner, "The Indispensable PC Handware Book", Adiison–Wesley, 1997, pp. 155, 156.*

* cited by examiner

Primary Examiner—Richard Hjerpe
Assistant Examiner—Alexander Eisen
(74) Attorney, Agent, or Firm—Greer, Burns & Crain, Ltd.

(57) ABSTRACT

A selector circuit comprises four 2-input selectors 50 to 53 each selecting in response to the complementary selection signals D2 and *D2 of MSB and a 4-input selector 24A selecting in response to complementary selection signals D1, *D1, D0 and *D0 of the lower 2 bit. In each of the 2-input selectors 50 to 53, one ends of two switching transistors are commonly connected to each other and the two switching transistors are adjacently arranged in the same row. In the 4-input selector 24A, 4 analogue switch circuits, each of which has two switching transistors arranged in the same row and serially connected, are arranged in parallel to one another and each is arranged in the same row as that of a corresponding 2-input selector. Same selectors are arranged in a row on a substrate and trunk lines for providing two families of gradation potentials V0 to V7 to the circuits are laid above the circuits. Upper/lower trunk line pairs are in the third and second wiring layer, respectively. The distance between adjacent trunk lines in the same wiring layer is 2d in a connecting area and is d in a non-connecting area. A trunk line in the third wiring layer is branched toward adjacent trunk line, and the branched line is connected through an interlayer contact to a line parallel to a trunk line in the second wiring layer.

10 Claims, 19 Drawing Sheets

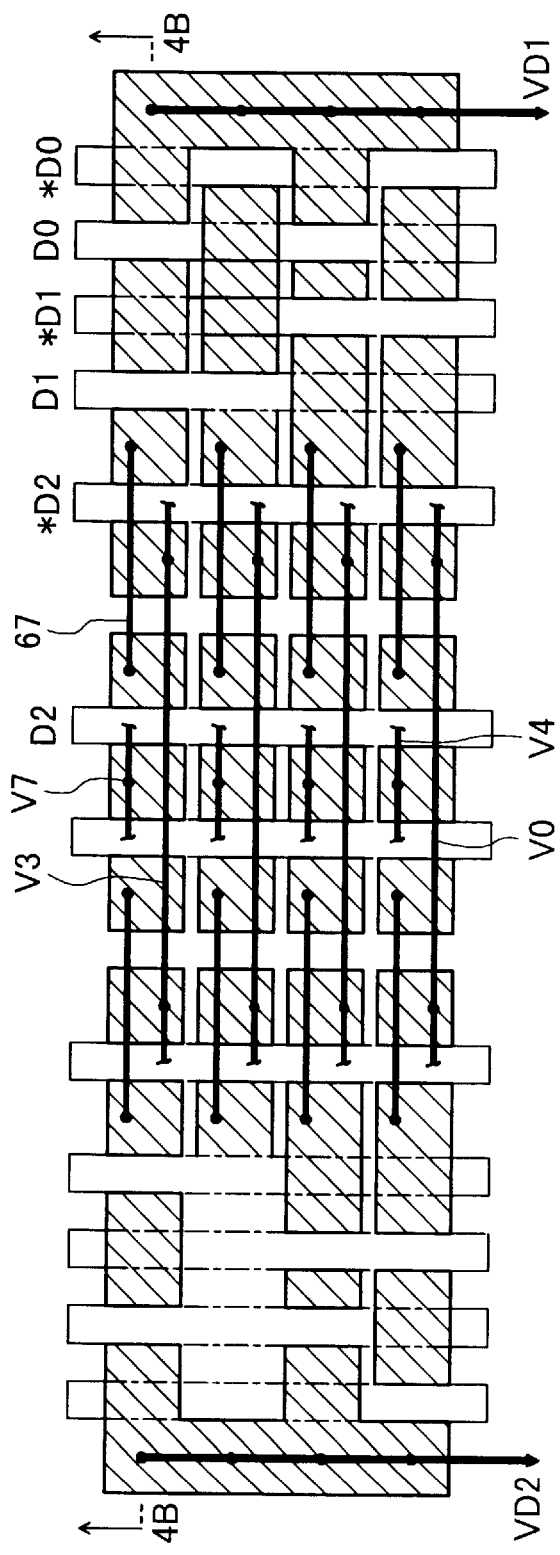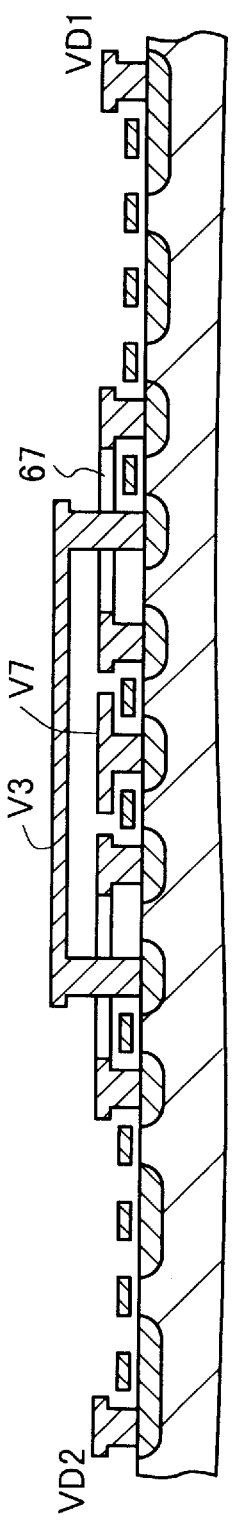
FIG.4(A)
FIG.4(B)

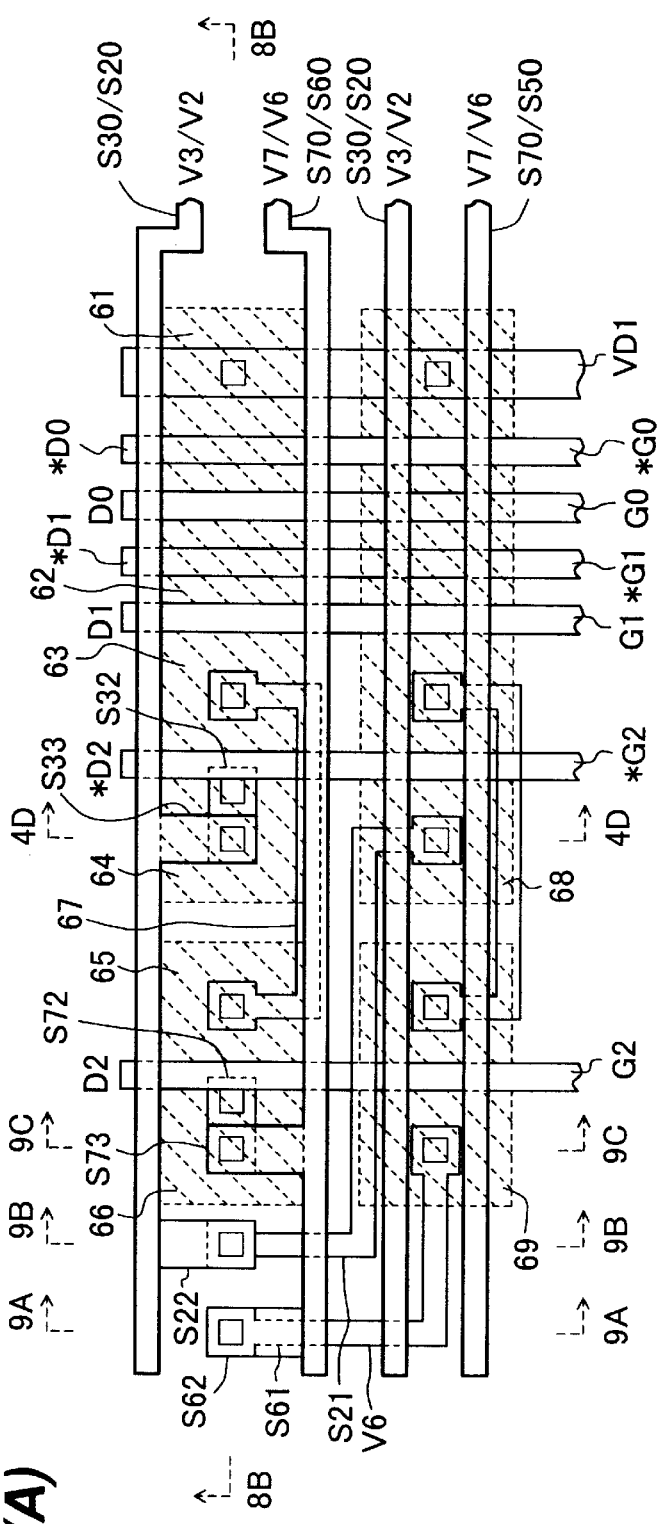
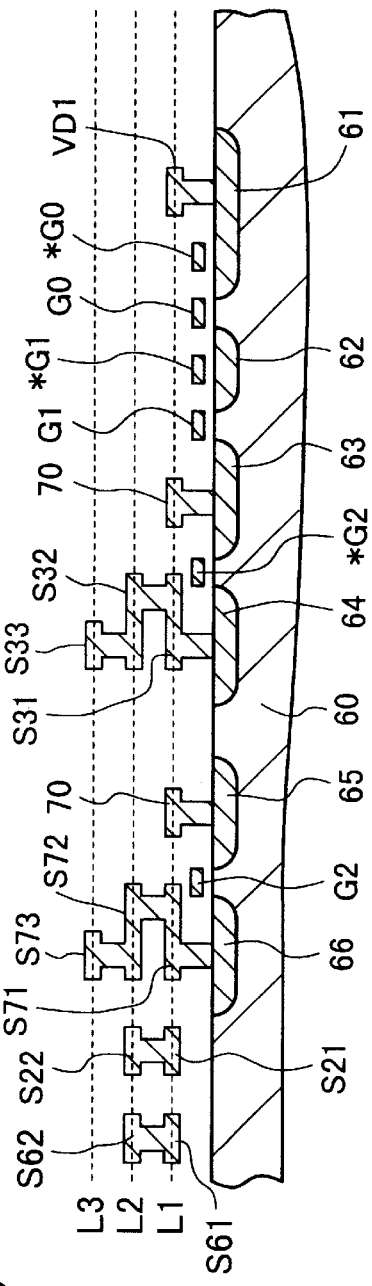
FIG.8(A)
FIG.8(B)

FIG.19(A) *prior art*
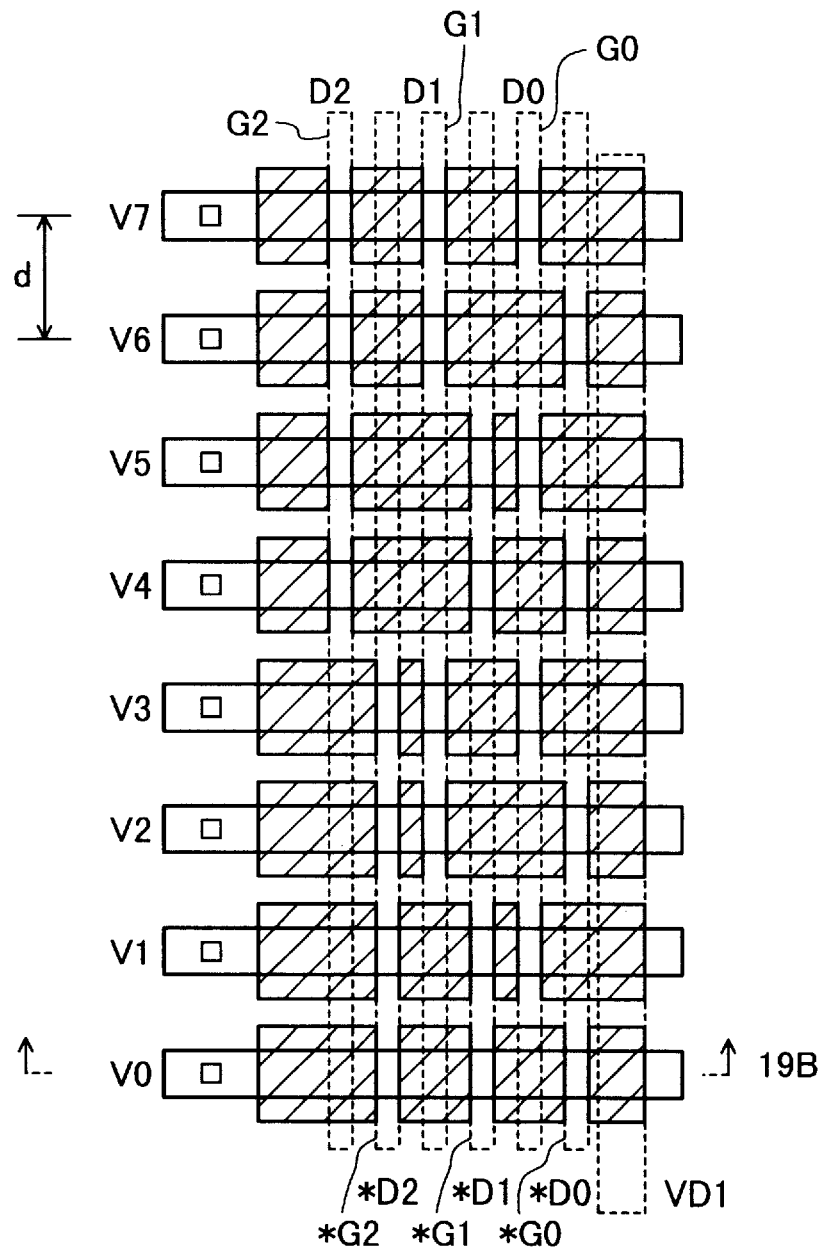
FIG.19(B) *prior art*
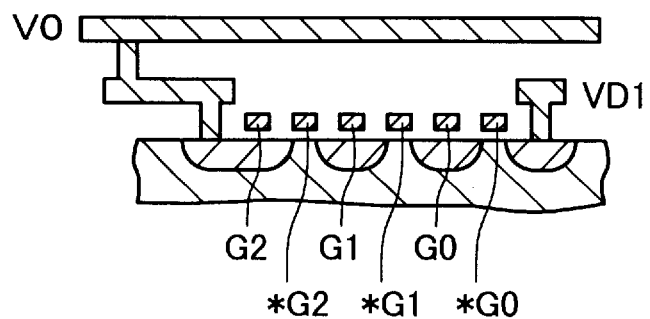

SELECTOR AND MULTILAYER INTERCONNECTION WITH REDUCED OCCUPIED AREA ON SUBSTRATE

BACKGROUND OF THE INVENTION

1. Field of the Invention

The present invention relates to a selector and a multilayer interconnection with a reduced occupied area on a substrate and particularly, to a plurality of selectors and a multilayer interconnection therefor in a semiconductor device.

2. Description of the Related Art

FIG. 17 shows a schematic configuration of a prior art multi-gradation liquid crystal display device of active matrix type. In FIG. 17, for simplicity, there is shown a case where a liquid crystal display panel 10 is of a monochrome display of 4×4 pixels.

Data lines X1 to X4 of the liquid crystal display panel 10 simultaneously receives display potentials for one line from outputs of a data driver 20. Scanning pulses are line-sequentially provided to scanning lines Y1 to Y4 of the liquid crystal display panel 10 from outputs of a scanning driver 30. The data driver 20 updates the display potentials on the data line X1 to X4 at each scanning pulse. The data driver 20 and the scanning driver 30 are controlled by a control circuit 40, and the control circuit 40 generates various kinds of control signals on the basis of a horizontal sync signal HS, a vertical sync signal VS and a clock CK.

The data driver 20 comprises a shift register 21 for point-sequentially generating latch pulses LCH1 to LCH4, two stage buffer registers 221 to 224 and 231 to 234, and a digital-to-analog converter circuit that converts contents of registers 231 to 234 to analogue voltages. The digital-to-analog converter circuit comprises selectors 241 to 244, output buffer circuits 251 to 254, and a gradation-potential generation circuit 26.

The shift register 21 receives, at a serial data input, a start pulse SP1 having the same cycle time as that of the horizontal sync signal HS, and the serial input data is shifted by a clock CK1 that is a pixel clock CK having passed through a buffer gate, whereby the shift register 21 sequentially outputs the latch pulses LCH1 to LCH4 from the parallel output thereof.

A digital video signal D of parallel N bits is provided commonly to the registers 221 to 224 and held in the registers 221 to 224 in the timing of the latch pulses LCH1 to LCH4, respectively. After display data of one line are held in the registers 221 to 224, the contents of the registers 221 to 224 are respectively written in the registers 231 to 234 in the timing of a latch pulse LCH5 of the same cycle time as that of the horizontal sync signal HS and the contents of the registers 221 to 224 are retained there for a time interval of one horizontal cycle time (one cycle time of the horizontal sync signal HS). For the interval, data of a next display line are stored in the registers 221 to 224 in the same way as described above.

The scanning driver 30 comprises buffer gates 31 to 34, and a shift register 35, wherein inputs of the buffer gates 31 to 34 are connected to respective bit outputs of the shift register 35. Outputs of the buffer gates 31 to 34 are respectively connected to the scanning lines Y1 to Y4 of the liquid crystal display panel 10. The shift register 35 receives, at its serial data input, a start pulse SP2 having the same cycle time as that of a vertical sync signal VS, and the received serial data is shifted in the register 35 by a clock CK2 having the same cycle time as that of the horizontal sync signal HS.

FIG. 18 shows an example of the above described digital-to-analog converter circuit. In FIG. 18, for simplicity, there is shown a case where an input is of 3 bits.

A gradation-potential generation circuit 26 outputs gradation potentials (reference potentials) V7 to V0 obtained with dividing a voltage between power supply potentials V7 and V0 by resistors R6 to R0. The selector 241 selectively outputs one of the gradation potentials V7 to V0 in response to an input data. Each bit of the input data consists of a pair of complementary signals, and generally a complementary signal of a bit D will be expressed by *D. The selector 241 is provided with analogue switch circuits each of which is constructed of switching transistors Qi0 to Qi2 serially connected to one another for each case of i=0 to 7. A gradation potential Vi is provided to one end of the analogue switch circuit having the transistors Qi0 to Qi2, and the other end thereof is commonly connected to an input end of the output buffer circuit 251. For each case of j=0 to 2, either of 1-bit selection signal Dj and *Dj is provided to the gate of a switching transistor Qij.

For example, when input data is '101', switching transistors Q42, Q52, Q62, Q72, Q01, Q11, Q41, Q51, Q10, Q30, Q50 and Q70 are turned on and the other switching transistors are turned off. Thereby, only the analogue switch circuit constructed of the switching transistors Q52, Q51 and Q50 is turned on and the gradation potential V5 is selectively outputted to be provided to the output buffer circuit 251.

FIG. 19(A) shows a layout pattern of the selector 241, and portions shaded by hatching are N-type regions and portions drawn with dashed lines are gate lines. FIG. 19(B) is a sectional view taken on line 19B—19B in FIG. 19(A), wherein insulator is not shown.

Referring back to FIG. 17, the liquid crystal display panel 10 is actually constituted of, for example, an array of 1024×768 color pixels each of which consists of 3 sub-pixels R (red), G (green) and B (blue). If the number of gradation levels of each pixel is 64 (6 bits), 64×6 switching transistors are required for one selector. Therefore, a total number of switching transistors in all the selectors of the digital-to-analog converter circuit amounts to 1024×3×64×6=1,179,648, which is a cause for increase in chip area or area of a LCD panel peripheral portion. This problem also occurs in a semiconductor device using selectors of this kind for different applications.

SUMMARY OF THE INVENTION

Accordingly, it is an object of the present invention to provide a selector circuit that can reduce an area occupied by transistors on a substrate, and a semiconductor device, a digital-to-analog converter circuit and a liquid crystal display device each comprising the selector circuit.

It is another object to provide a semiconductor device and a display device in both of which wiring area can be reduced by multilayer interconnection, in a case where a plurality of the same circuits are arranged on a substrate substantially in a row, and lines, which provide a plurality of potentials to the circuits, are in parallel arranged in a congested manner above the circuits.

In the first aspect of the present invention, there is provided a selector circuit for selectively outputting one of $2^n$ input signals in response to n-bit selection signals, comprising: $2^{n-1}$ 2-input selectors, each 2-input selector selecting one of two inputs in response to a 1-bit selection signal among the n-bit selection signals, and a $2^{n-1}$ 2-input selector for selecting one of signals selected by the $2^{n-1}$ selectors in response to the n-bit selection signals except the 1-bit selection signal, wherein each of the $2^{n-1}$ 2-input selectors includes: a first switching transistor being on-off controlled by the 1-bit selection signal, the first switching transistor having an input for receiving one of the two inputs and having an output, and a second switching transistor being controlled so that its on/off state is reverse from that of the first switching transistor, the second switching transistor having an input for receiving the other of the two inputs and having an output connected to the output of the first switching transistor, wherein the first and second switching transistor of each 2-input selector are arranged in a row, and the $2^{n-1}$ 2-input selectors are arranged in parallel to one another.

With this aspect, since the number of signals is reduced in half by $2^{n-1}$ 2-input selectors, one of the signals whose number has been reduced in half is selected by a $2^{n-1}$ input selector and therefore, the number of switching transistors of the selector circuit and a total area occupied by the switching transistors can be reduced. Further, because of the same row arrangement, it is possible to further reduce the total area occupied by transistors of the selector circuit.

In the second aspect of the present invention, there is provided a semiconductor device wherein a plurality of the same circuits are arranged substantially in a row, and lines for supplying potentials to the circuits are laid above the circuits, wherein the lines include a plurality of upper/lower trunk line pairs each consisting of an upper trunk line and a lower trunk line adjacent upper and lower, a plurality of line groups each consisting of two or three upper/lower trunk line pairs are arranged substantially in parallel to each other, and a distance between adjacent trunk lines in a connecting portion to a circuit, in the same wiring layer and of the same line group is substantially twice as long as a distance between adjacent line groups, wherein one of the upper trunk lines has a branched line toward an adjacent upper trunk line in the same wiring layer and of the same line group, the branched line is connected through an interlayer contact to a inter line which is in the lower wiring layer and parallel to the lower trunk lines.

With this aspect, more potential supply lines can be arranged in the same wiring area than when only second layer lines are arranged in parallel at the same pitch as in the prior art case, or when second and third layer lines are uniformly arranged at a pitch twice as large as a pitch in the prior art case. In other words, wiring area required in the prior art case can be reduced and thereby, a peripheral portion area of a display panel, on which a semiconductor chip or TFTs are provided, can be reduced.

Other aspects, objects, and the advantages of the present invention will become apparent from the following detailed description taken in connection with the accompanying drawings.

BRIEF DESCRIPTION OF THE DRAWINGS

FIG. 4(A) is a plan view showing an on-chip layout pattern of the circuit of FIG. 3;

FIG. 4(B) is a sectional view taken on line 4B—4B in FIG. 4(A), in which insulator is not shown;

FIG. 8(A) is an enlarged plan view of the upper half of the selector 24A in FIG. 7;

FIG. 8(B) is a sectional view taken on line 8B—8B in FIG. 8(A);

FIG. 19(A) is a plan view showing a layout pattern of a prior art selector in FIG. 18; and FIG. 19(B) is a sectional view taken on line 19B—19B of FIG. 19(A), in which insulator is not shown.

DESCRIPTION OF THE PREFERRED EMBODIMENTS

Figure 1:
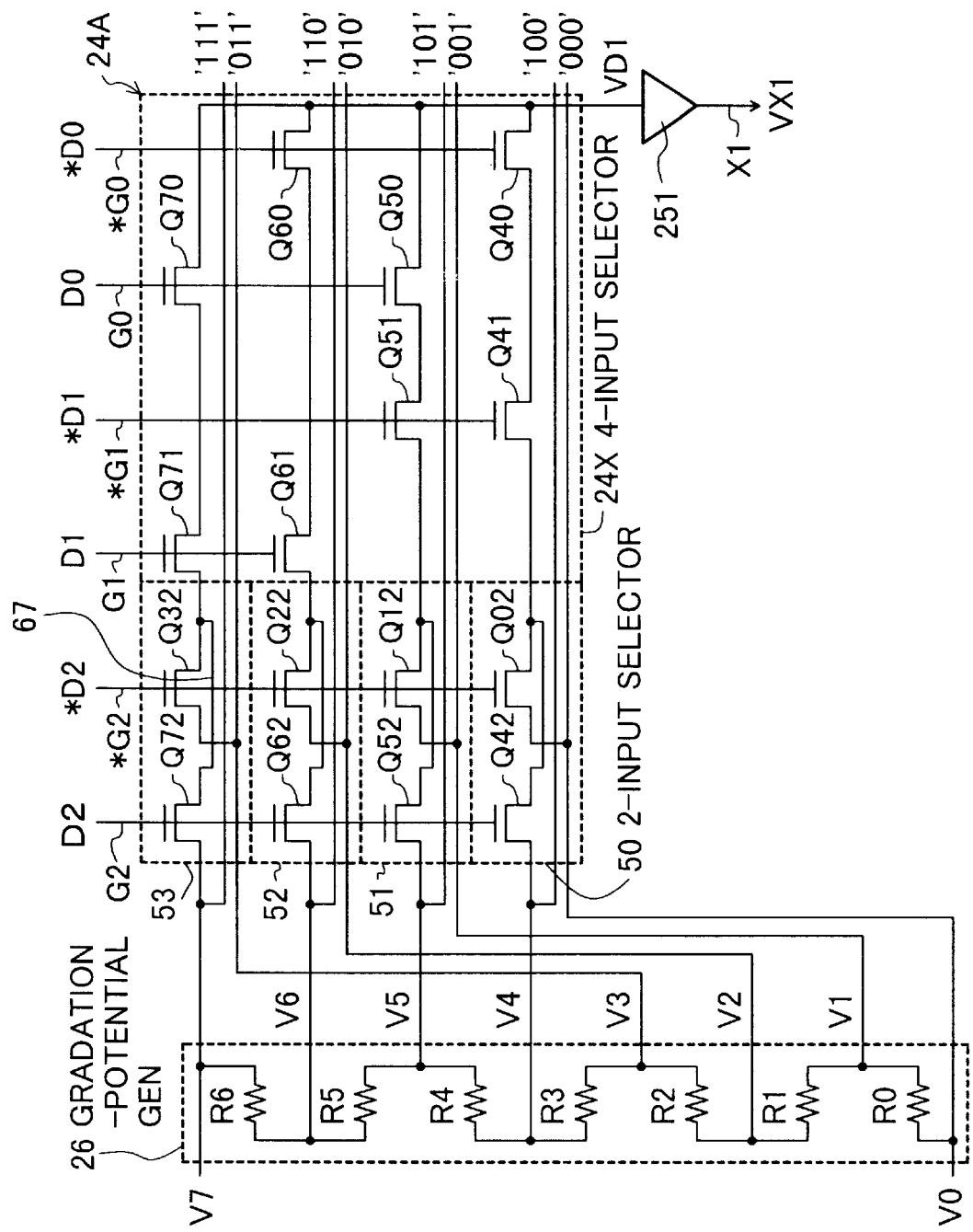
FIG. 1 is a diagram showing a digital-to-analog converter circuit of a first embodiment according to the present invention.

Referring now to the drawings, wherein like reference characters designate like or corresponding parts throughout several views, preferred embodiments of the present invention are described below. A signal which is active low will be denoted with adding * to a reference character.

First Embodiment

Figure 18:
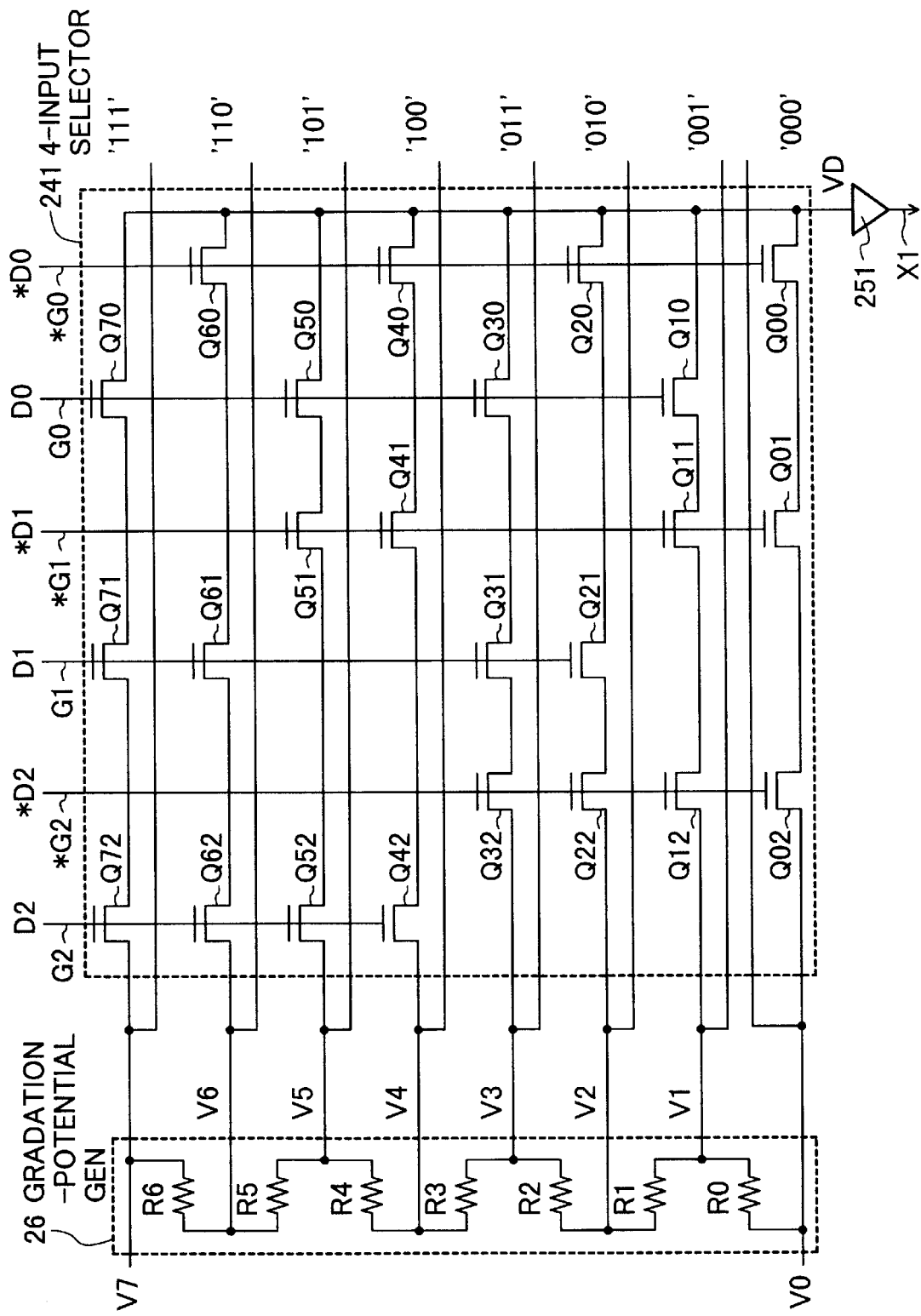
FIG. 18 is a diagram showing a prior art digital-to-analog converter circuit in FIG. 17.

FIG. 1 shows a digital-to-analog converter circuit of a first embodiment according to the present invention, which corresponds to FIG. 18.

The gradation-potential generation circuit 26 outputs the gradation potentials (reference potentials) V7 to V0 obtained with dividing the voltage between the power supply potentials V7 and V0 by resistors R6 to R0, and a selector 24A selectively outputs one of the gradation potentials V7 to V0 in response to the input data (3 bit selection signals).

Figure 17:
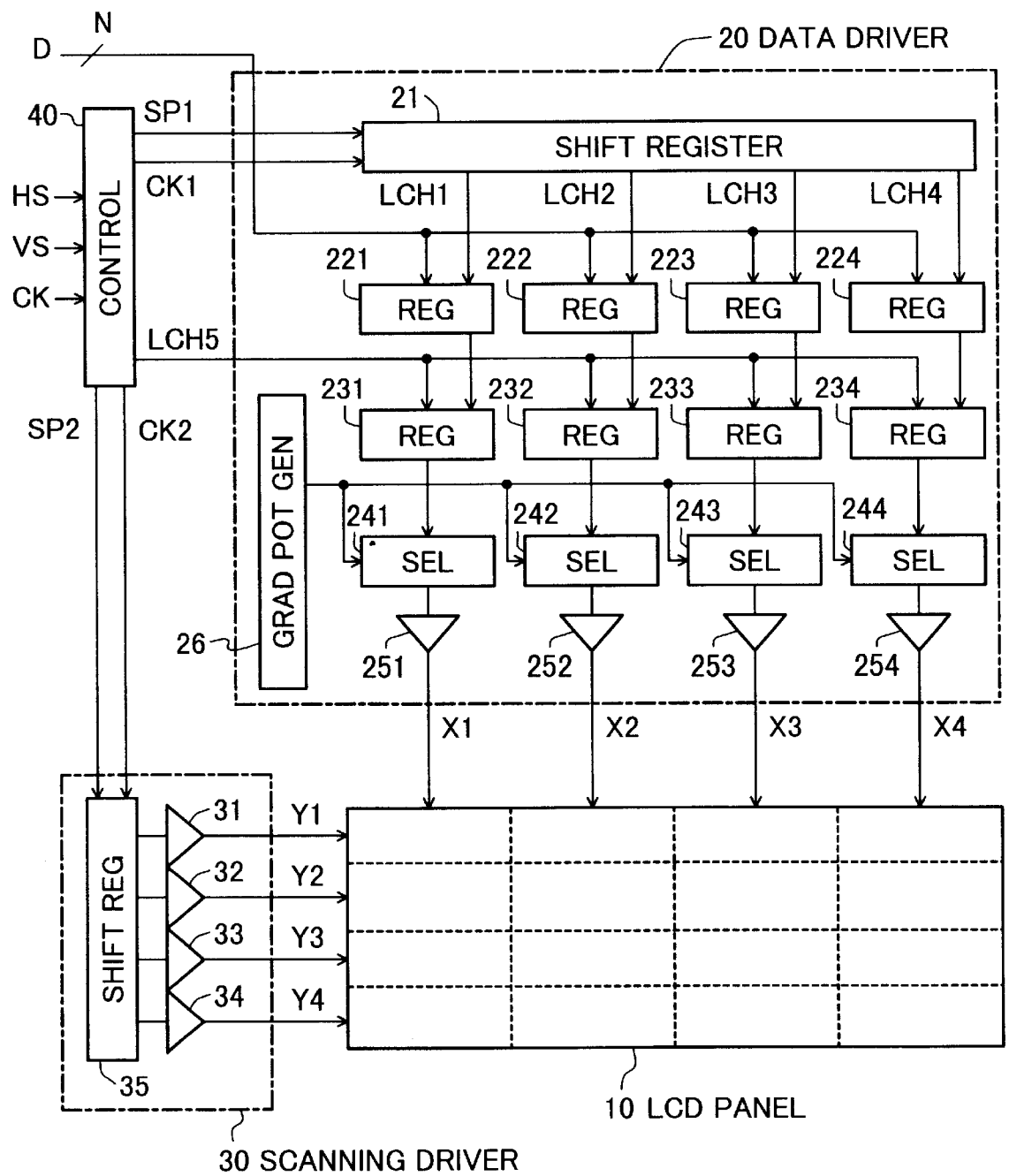
FIG. 17 is a schematic block diagram showing a prior art multi-gradation liquid crystal display device of active matrix type.

The selector 24A is used, for example, instead of the selector 241 in FIG. 17, and similarly this applies to the other selectors 242 to 244 in FIG. 17.

The selector 24A comprises a circuit having 2-input selectors 50 to 53 which selects one of a first group consisting of gradation potentials V0 to V3 and a second group consisting of gradation potentials V4 to V7 in response to complementary data (1-bit selection signal) D2 and D2* of the MSB of the input data; and a 4-input selector 24X that selects one of outputs of the circuit having the elements 50 to 53 in response to complementary data D1, *D1, D0 and *D0 of the lower 2 bits of the input data.

The selector 24A has the following relation with the selector 241 in FIG. 18.

In FIG. 18, from the upper side, in the fourth and eighth rows of the switching transistor array of the selector 241, the switching transistors Q40 and Q00 are both on/off controlled by the signal *D0 provided to a gate line *G0, and the switching transistors Q41 and Q01 are both on-off controlled by the signal *D1 provided to a gate line *G1. On the other hand, the switching transistors Q42 and Q02 are on-off controlled by the signals D2 and *D2, respectively, provided to gate lines G2 and *G2. With these, in the selector 24A in FIG. 1, one end of the switching transistor Q02 is connected to a node between the switching transistors Q41 and Q42 and thereby, the switching transistors Q00 and Q01 in FIG. 18 are omitted. The 2-input selector 50 for selecting one of the gradation potentials V4 and V0 is constructed of the switching transistors Q42 and Q02.

Likewise, in FIG. 1, one end of the switching transistor Q12 is connected to a node between the switching transistors Q51 and Q52 and thereby, the switching transistors Q10 and Q11 in FIG. 18 are omitted. One end of the switching transistor Q22 is connected to a node between the switching transistors Q61 and Q62 and thereby, switching the transistors Q20 and Q21 in FIG. 18 are omitted. One end of the switching transistor Q32 is connected to a node between the switching transistors Q71 and Q72 and thereby, the switching transistors Q30 and Q31 in FIG. 18 are omitted. The 2-input selector 51 for selecting one of the gradation potentials V5 and V1 is constructed of the switching transistors Q52 and Q12. The 2-input selector 52 for selecting one of the gradation potentials V6 and V2 is constructed of the switching transistors Q62 and Q22. The 2-input selector 53 for selecting one of the gradation potentials V6 and V2 is constructed of the switching transistors Q72 and Q32.

The gate line *G0 receiving the signal *D0 is common with the switching transistors Q60 and Q40. The gate line G0 receiving the signal D0 is common with the switching transistors Q70 and Q50. The gate line *G1 receiving the signal *D1 is common with the switching transistors Q51 and Q41. The gate line G1 receiving the signal D1 is common with the switching transistors Q71 and Q61. The gate line *G2 receiving the signal *D2 is common with the switching transistors Q32, Q22, Q12 and Q02. The gate line G2 receiving the signal D2 is common with the switching transistors Q72, Q62, Q52 and Q42.

A reference voltage selected in the selector 24A is provided to the output buffer circuit 251 as a potential VD1. The output buffer circuit 251 is, for example, a voltage follower circuit or a source follower circuit. A potential VX1 of a data line X1 connected to the output of the output buffer circuit 251 is almost equal to the potential VD1 or the potential shifted from VD1 by a given value.

In the above described configuration, when the signals D1 and D0 are high, the switching transistors Q71 and Q70 are on. In addition, if a signal D2 is high, a switching transistor Q72 is on and the gradation potential V7 is selected, and on the contrary, if the signal D2 is low, the switching transistor Q32 is on and the gradation potential V3 is selected. That is, when (D1, D0)=(1, 1), V7 is selected if D2='1', and V3 is selected if D2='0.' Likewise, when (D1, D0)=(1, 0), V6 is selected if D2='1', and V2 is selected if D2='0.' Besides, when (D1, D0)=(0, 0), V4 is selected if D2='1', and V0 is selected if D2='0.'

In order to design an on-chip area of the selector 24A to the lowest possible, the switching transistor Q02 is arranged in the same row of the switching transistors Q40, Q41 and Q42 and further, disposed next to the switching transistor Q42. Each of the other transistor rows is similar to such a configuration.

Figure 2A:
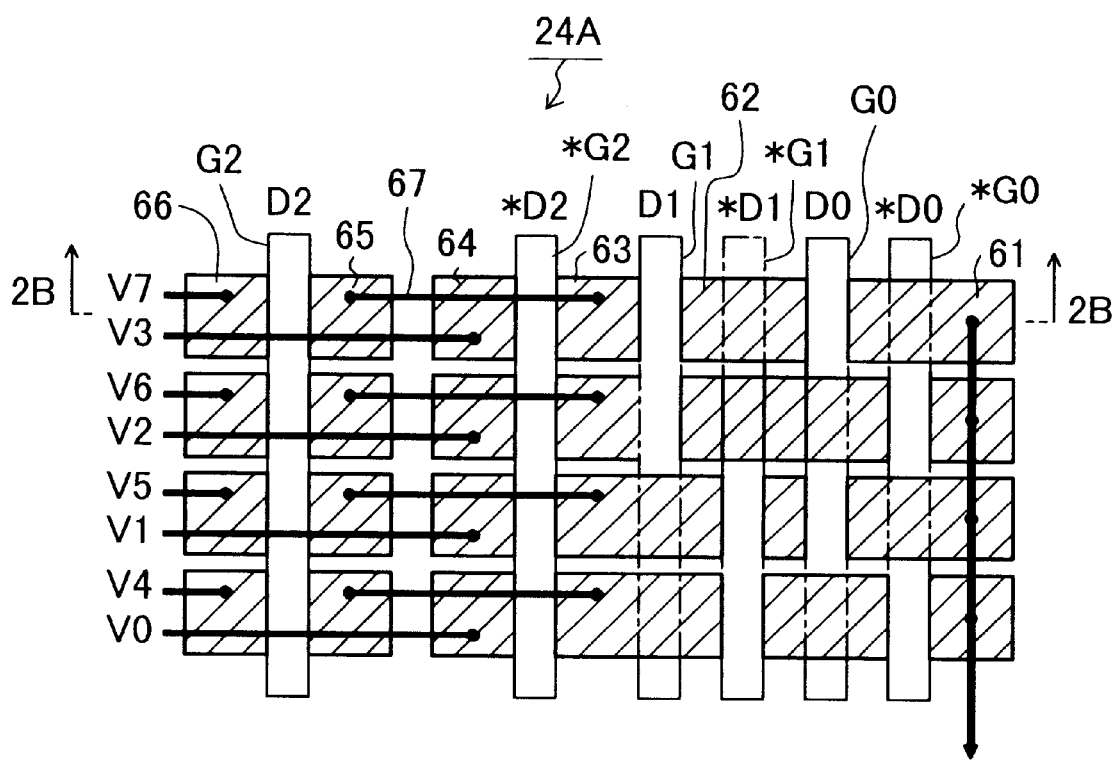
FIG. 2(A) is a plan view showing an on-chip layout pattern of the selector in FIG. 1.
Figure 2B:
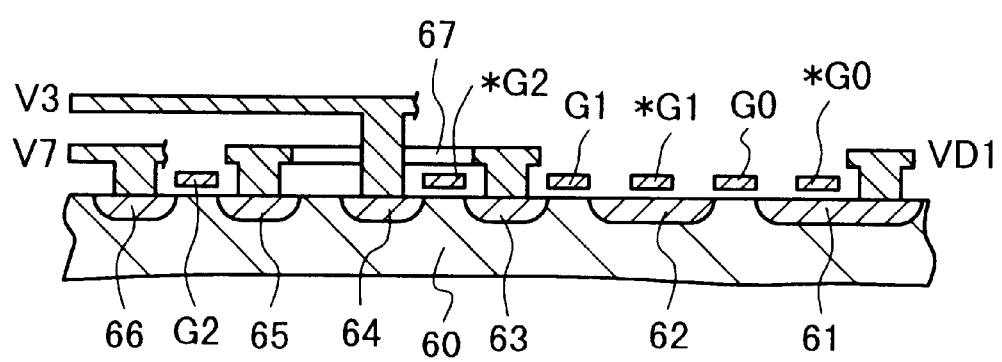
FIG. 2(B) is a sectional view taken on line 2B—2B in FIG. 2(A), in which insulator is not shown.

FIG. 2(A) shows an on-chip layout pattern of the selector 24A in a case where each switching transistor is constituted of an NMOS transistor. Portions that are shaded with hatching show N-type regions, and portions encircled by short and long dashed lines show gate lines. In FIG. 2(A), metal lines connecting between N-type regions are drawn with bold lines. FIG. 2(B) is the sectional view taken on line 2B—2B in FIG. 2(A), in which insulator is omitted.

In FIG. 2(B), reference characters 61 to 66 indicate N-type regions formed on a P-type substrate 60. For example, the switching transistor Q70 is constructed of an N-type region 61;, an N-type region 62, a P-type region between the N-type regions 61 and 62, a gate oxide film above the between-region, and a gate line *G0 above the film. The interconnecting line 67 is in a first metal wiring layer and for connecting the N-type region 65 that is one end of the switching transistor Q72 and the N-type region 63 that is one end of the switching transistor Q32.

In order to narrow wiring area, lines for providing the gradation potentials V3 and V7 to the N-type regions 64 an 66 in the same row are formed in a third metal wiring layer and a second metal wiring layer, respectively. The upper line having the potential V3 is adjacent to the lower line having the potential V7, and these lines extend toward another selector, not shown, which is arranged in parallel to the selector 24A.

Although the number of switching transistors of the selector 241 in FIG. 18 is 3×8=24, the corresponding number in FIG. 1 is (3+1)×(8/2)=16. When such a selector is applied to a data driver for a liquid crystal display panel with 64 gradation display levels, the number of switching transistors is of ((64/2)×(6+1))/(64×6)=7/12 times the number in the prior art case. In such a manner, according to the first embodiment, the number of switching transistors is greatly reduced compared with prior art case.

Further, because of this reduction and the configuration of each of the 2-input selectors 50 to 53 arranged in one row, a transistor-occupied area of the selector 24A shown in FIG. 2(A) is greatly reduced compared with that in FIG. 19(A) and thereby, a chip area of a semiconductor device using the selector 24A and a non-display area in the peripheral portion of a liquid crystal display panel are reduced.

Second Embodiment

In a data driver on a liquid crystal display panel, since, for example, 300 selectors each having a circuit 24A of FIG. 2(A) are arranged in a row on one chip, it is preferable that a total area is further reduced by forming common portions.

Figure 3:
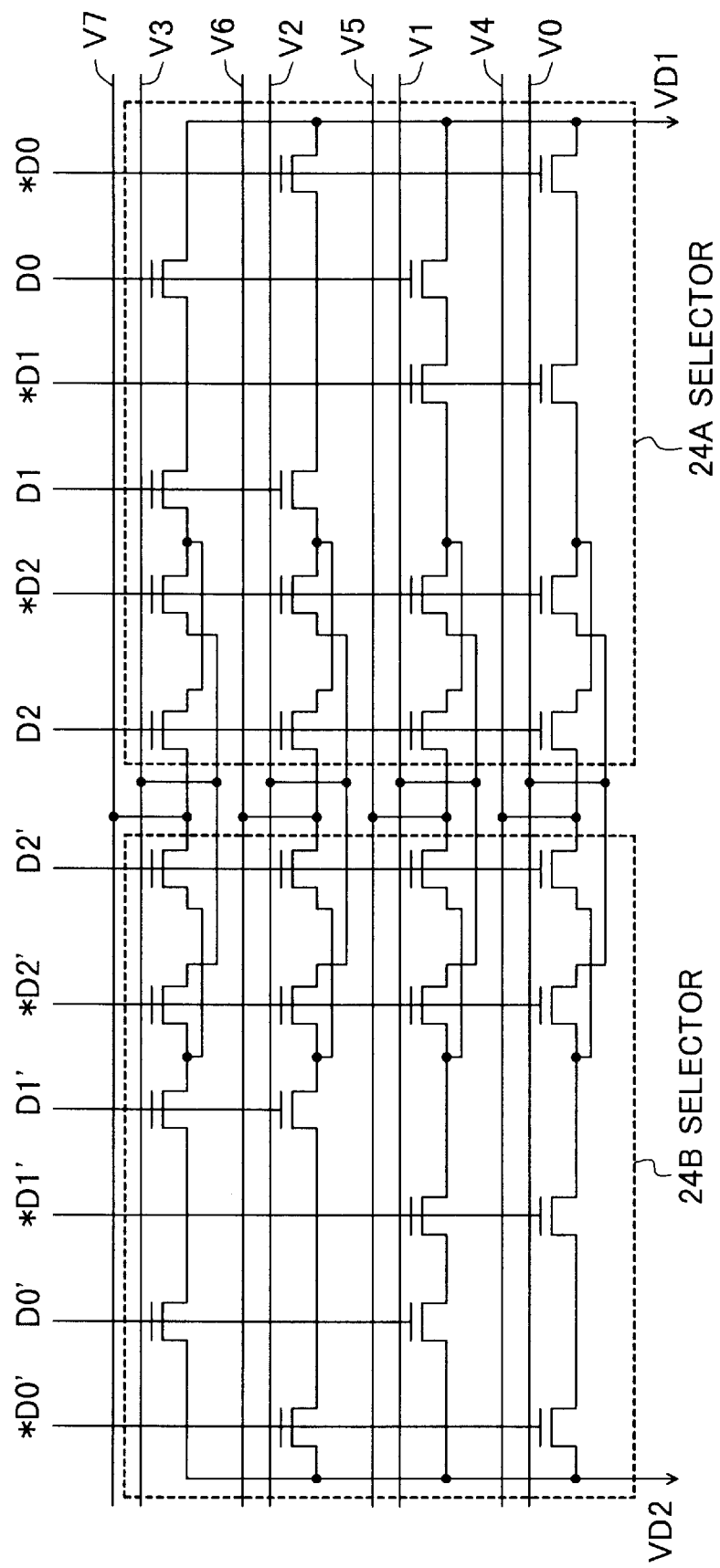
FIG. 3 is a circuit diagram showing two selectors arranged n a row, of a second embodiment according to the present invention.

FIG. 3 shows two selectors arranged in a row, of the second embodiment.

FIG. 4(A) shows a on-chip layout pattern of a circuit of FIG. 3 in a case where each switching transistor is constituted of an NMOS transistor. Hatched portions show N-type regions and portions encircled by short and long dashed lines show gate lines. FIG. 4(B) is the sectional view taken on line 4B—4B in FIG. 4(A), in which insulator is not shown.

In the circuit of FIG. 3, switching transistors of the selector 24B are arranged in a symmetrical manner with those of the selector 24A, and one input section of gradation potentials V0 to V7 provided to the selectors 24A and 24B is common. Thereby, a chip area thereof is reduced compared with the case where two selectors are arranged merely in a row without symmetry.

Third Embodiment

Figure 5:
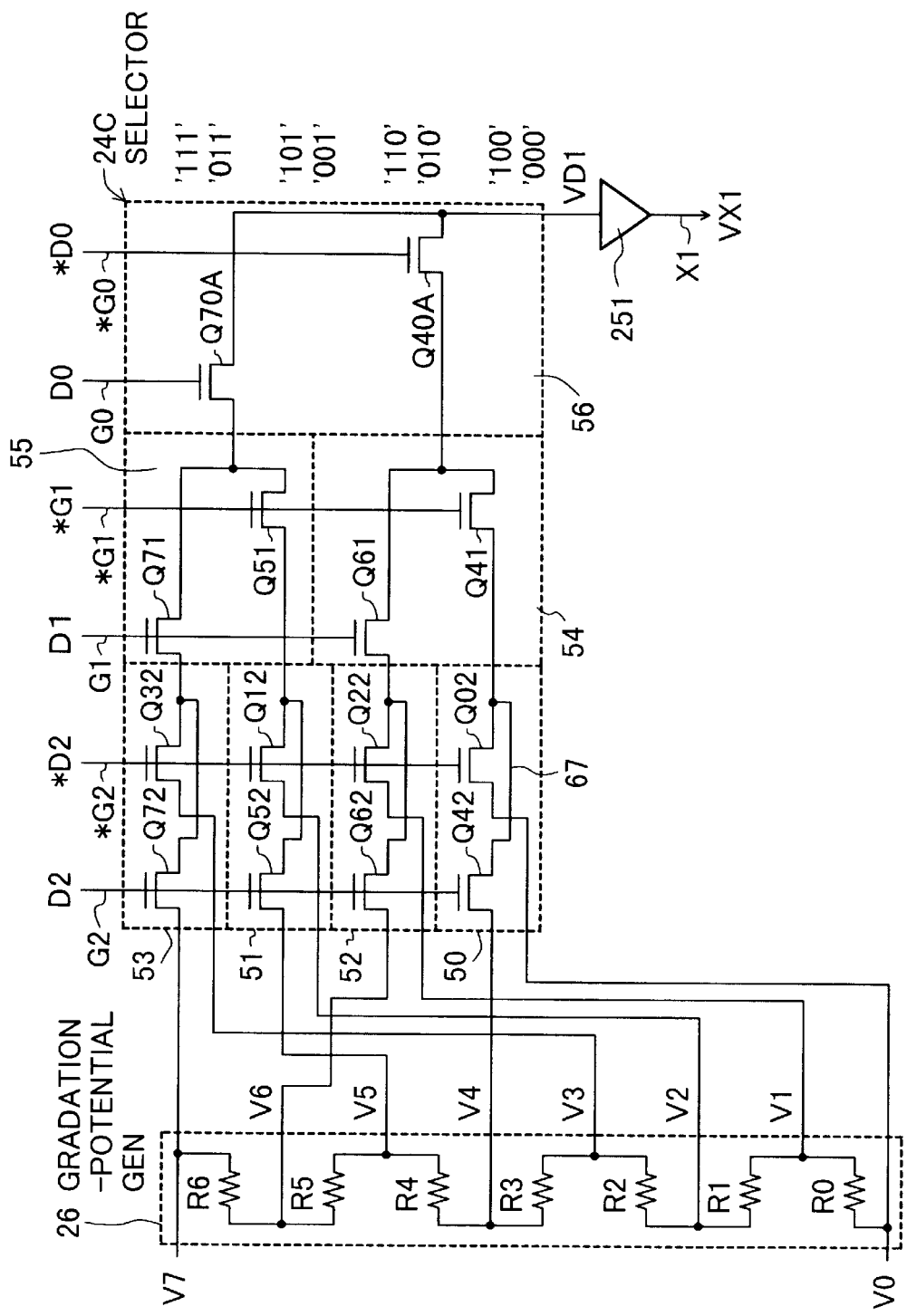
FIG. 5 is a diagram showing a digital-to-analog converter circuit of a third embodiment according to the present invention.

FIG. 5 shows a selector of the third embodiment according to the present invention.

In FIG. 1, the switching transistors Q50 and Q70 of the selector 24A have the common gate line G0, and also the switching transistors Q40 and Q60 have the common gate line *G0. Therefore, by interchange of the second and third rows of the switching transistor array with each other, the switching transistors Q50 and Q70 come to be arranged so as to be adjacent to each other and besides, the switching transistors Q60 and Q40 come to be arranged so as to be adjacent to each other. The selector 24C in FIG. 5 has a configuration wherein, in this state, the switching transistors Q70 and Q50 in FIG. 1 are replaced with a common switching transistor Q70A and the switching transistors Q40 and Q50 are replaced with a common switching transistor Q40A.

In this configuration, as a result, 2-input selectors 50 to 56 are arranged in a tree structure, and only one of the gradation potentials V0 to V7 is finally selected in tournament selection. The 2-input selectors 50 to 53 are the same as those of FIG. 1. One of outputs of the 2-input selectors 50 and 52 is selected by the 2-input selector 54 constructed of the switching transistors Q41 and Q61. One of outputs of the 2 input selectors 51 and 53 is selected by the 2-input selector 55 constructed of the switching transistors Q51 and Q71. One of outputs of the 2-input selectors 54 and 55 is selected by the 2-input selector 56 constructed of the switching transistors Q40A and Q70A.

Figure 6:
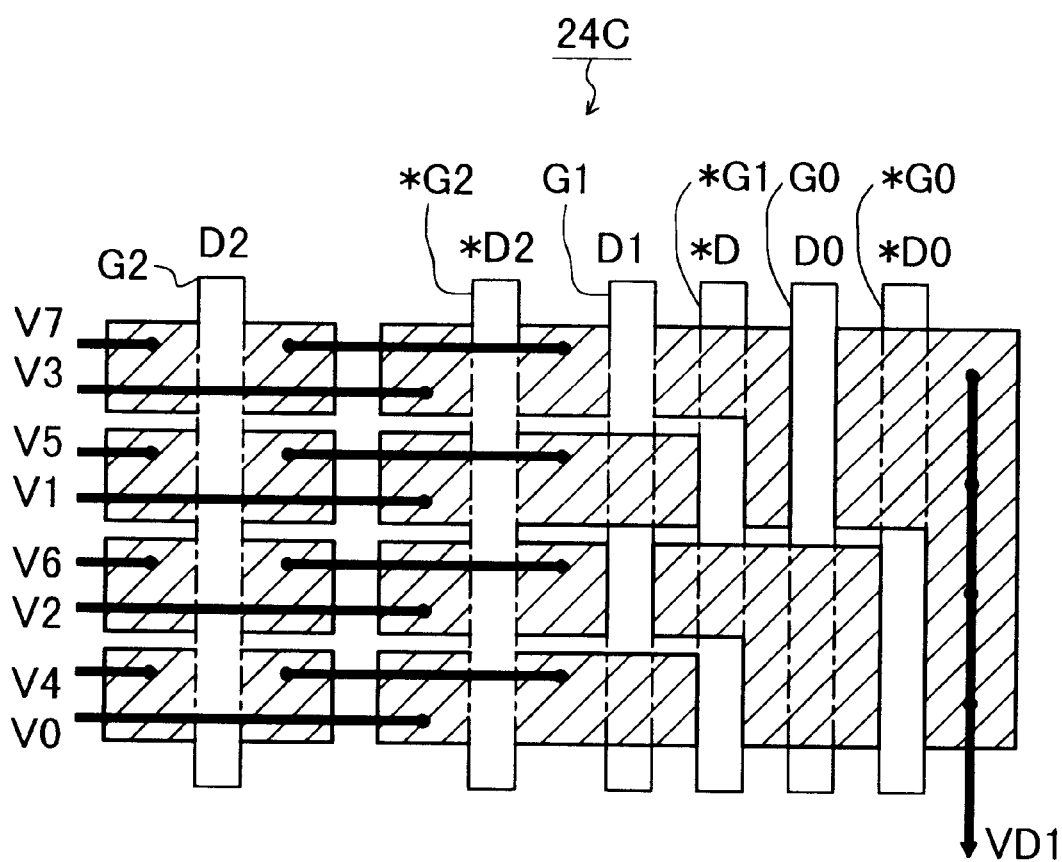
FIG. 6 is a plan view showing an on-chip layout pattern of the selector in FIG. 5.

FIG. 6 shows an on-chip layout pattern of the selector 24C in a case where each switching transistor is constituted of an NMOS transistor. Hatched portions show N-type regions and portions encircled by short and long dashed lines show gate lines.

According to the selector 24C, since areas for the switching transistors Q40A and Q70A can each be larger than an area of each of other switching transistors, an on-resistance of the selector 24C is smaller than in the case of FIG. 2(A) and a higher speed operation will be achieved.

Fourth Embodiment

Next, in the first embodiment, it will be considered to reduce a chip area by reducing the number of gradation-potential supply lines.

Figure 7:
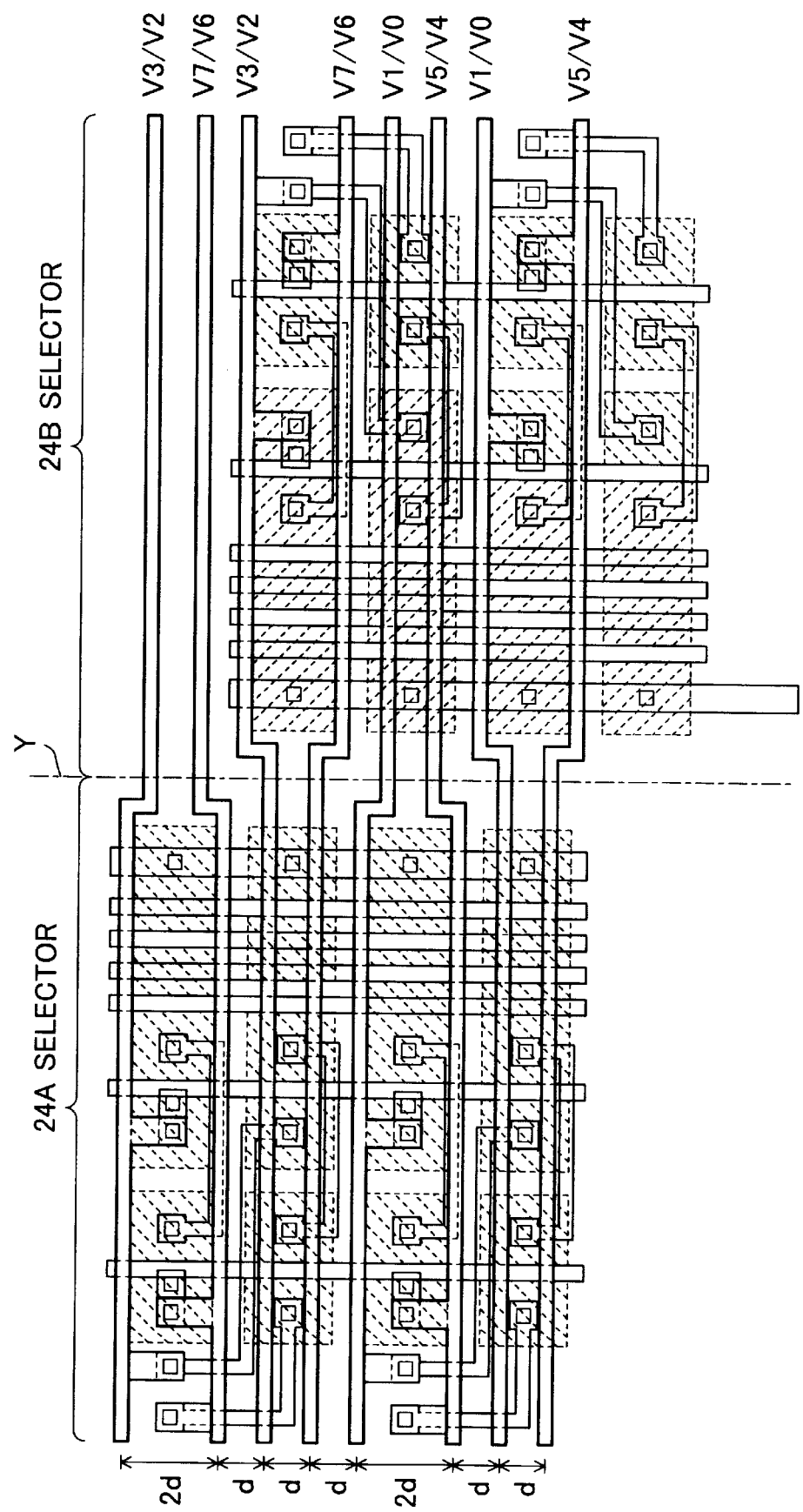
FIG. 7 is a plan view showing an on-chip layout pattern of two selectors arranged substantially in a row, in a data driver of a fourth embodiment according to the present invention.
Figure 9A:
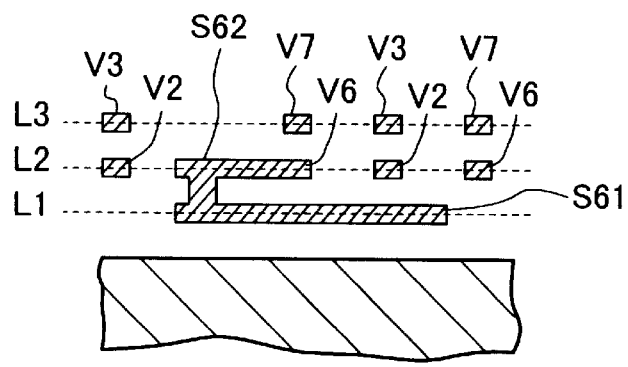
FIGS. 9(A) to 9(D) are sectional views taken on lines 9A—9A, 9B—9B, 9C—9C and 9D—9D in FIG. 8(A)
Figure 9B:
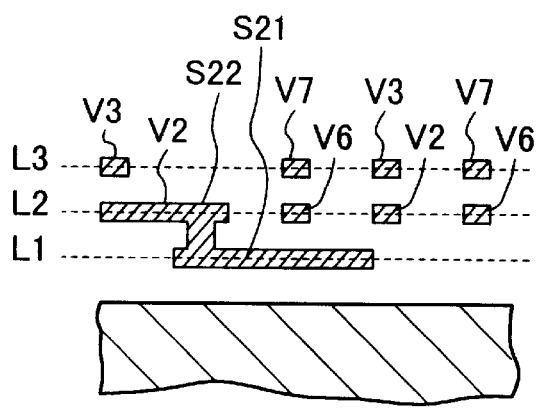
Figure 9C:
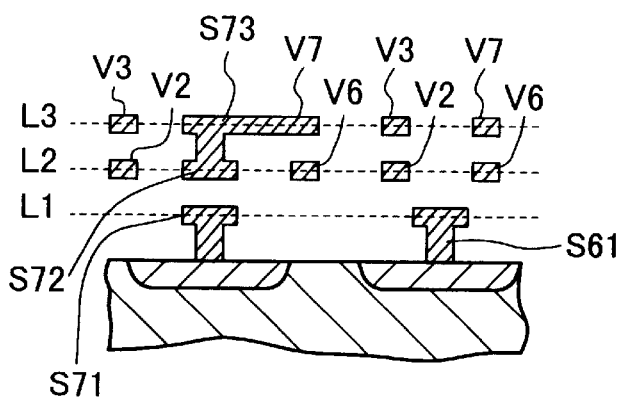
Figure 9D:
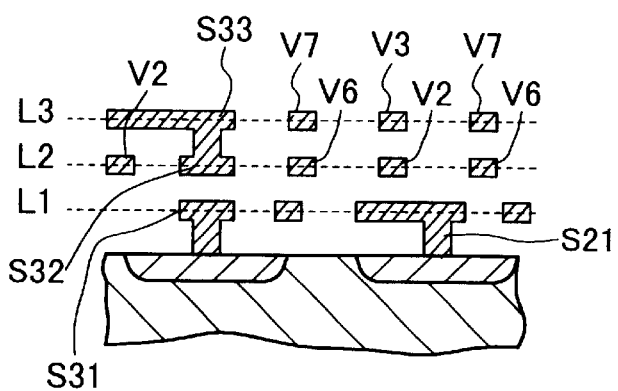

FIG. 7 shows the on-chip layout pattern of two selector 24A and 24B that are arranged substantially in a row in a data driver. Hatched portions show N-type regions each constituting a source or a drain of an NMOS transistor.

The pattern of the selector 24B is obtained firstly by symmetric conversion of the pattern of the selector 24A with respect to a line Y, and secondly by shifting the converted pattern in the direction of the line Y which is perpendicular to the direction of the gradation-potential supply lines. In FIG. 7, patterns having edges drawn with bold lines are gradation-potential supply lines each of which is constituted of the second (lower) and third (upper) layer line pair (upper/lower line pair) adjacent upper and lower. In FIG. 7, for example, V3/V2 indicates that the gradation potentials of the supply lines of the upper/lower pair in the third and second wiring layer are respectively V3 and V2. In order to reduce voltage drops by respective resistance of supply lines, a gradation-potential generation circuit (not shown) is formed in the middle portion of a semiconductor chip, and each of the supply lines extends in both ways from the circuit.

In the gradation-potential supply lines in FIG. 7, two trunk upper/lower line pairs from the upper side of FIG. 7 are connected to the selector 24A, but not connected to the selector 24B. That is, this line pair is in a connection section in the selector 24A, but in a non-connection section in the selector 24B. Since the supply lines in the same wiring layer in the non-connection section have no branches in directions perpendicular to the trunk lines, a distance therebetween may be the minimum d (half as large as that of the connection section) which meets a design rule. The third and fourth upper/lower line pairs from the upper side in FIG. 7, to the contrary, are a non-connection section and a connection section in the selectors 24A and 24B, respectively. A combination of gradation potentials supplied to the selector 24B in this connection section may be same or may not be same as that supplied to that connection section of the selector 24A. For example, the selectors 24A and 24B respectively may employ gradation-potential supply lines having different potential combinations, and the both supply line combinations may be connected to potential outputs of the same or different gradation-potential generation circuits.

A pattern of the fifth to eighth upper/lower trunk line pairs from the upper side in FIG. 7 is the same as that of the first to fourth upper/lower trunk line pairs.

FIG. 8(A) is the enlarged view of the upper half of the selector 24A in FIG. 7. FIG. 8(B) is a sectional view taken on line 8B—8B in FIG. 8(A). FIGS. 9(A) to 9(D) are sectional views taken on line 9A—9A, 9B—9B, 9C—9C and 9D—9D, respectively, in FIG. 8(A). In each of the sectional views, insulator above the semiconductor substrate 60 is omitted to show.

In the sectional views, reference characters L1 to L3 indicate the first to third wiring layers, respectively. Further, a truck line portion of a gradation-potential supply line having a potential Vi is generally denoted as SiO, and a jth-layer line which is a branch of the trunk line SiO or a line connected to the branch is denoted as Sij.

In FIG. 8(B), reference characters 61 to 66 indicate N-type regions formed on P-type substrate 60. For example, the switching transistor Q70 is constructed of an N-type region 61, an N-type region 62, a P-type region between the N-type regions 61 and 62, a gate oxide film above the between-region, and a gate line *G0 above the film.

The interconnecting line 67 is in the first metal wiring layer L1 and for connecting the N-type region 65 that is one end of the switching transistor Q72 and the N-type region 63 that is one end of the switching transistor Q32.

Potentials V3 and V7 from trunk lines S30 and S70 adjacent to each other in the third and second wiring layer are provided to the N-type regions 64 and 66, respectively.

Namely, a line S33 is branched form the trunk line S30 toward the adjacent trunk line S70 and the fore-end is connected through an interlayer contact to the inter line S32 in the lower wiring layer. The line S32 is parallel to the adjacent trunk line S20 and S60 in order to secure a distance d between the adjacent lines. The fore-end of the inter line S32 is connected through an interlayer contact to a line S31 in the lower wiring layer. The inter line S31 is arranged to be adjacent to the inter line S32 one above the other, and the size of the line S31 is the same as that of the line S32 in order to increase an interconnect region that can be used by other interconnecting lines, with locally reducing in area occupied by wiring. The fore-end of the line S31 is connected through a substrate contact to an N-type regions 64 located downward. With such connections, the potential V3 is provided to a gradation potential input end of the switching transistor Q32 in FIG. 1. Likewise, the trunk line S70 is connected to the N-type region 66 through a line S73, an interlayer contact, a line S72, an interlayer contact, a line S71 and a substrate contact. With such connections, the potential V7 is provided to a gradation potential input end of the switching transistor Q72 in FIG. 1.

N-type regions 68 and 69 of the second row are respectively provided with potentials from the adjacent trunk lines S20 and S60 in the second wiring layer L2.

That is, a line S22 is branched from the trunk line 20 toward the adjacent trunk line S60, and the fore-end of the line S22 is connected through an interlayer contact to a line S21 in the lower wiring layer. The line S21 secures more than a distance d from the line 67 in the same wiring layer, and is connected through a substrate contact to the N-type region 68 located downward. With these connections, the potential V2 is provided to a gradation potential input end of the switching transistor Q22 in FIG. 1. Likewise, the trunk line 60 is connected to the N-type region 69 through a line S62, an interlayer contact, a line S61 and a substrate contact, whereby the potential V6 is provided to a gradation potential input end of the switching transistor Q62 in FIG. 1. The line S61 secures a distance d from the line S21 in the same wiring layer.

In FIG. 7, when gradation-potential supply lines are arranged straight with no bending in the vicinity of a straight line Y, and a design rule is satisfied that adjacent lines in the same wiring layer has to secure a distance equal to or more than d, wiring region width in a direction perpendicular to the trunk line is 12d, whereas according to the fourth embodiment, the corresponding width is 9d. Therefore, wiring area is reduced and reduction in chip area is achieved.

Fifth Embodiment

Figure 10:
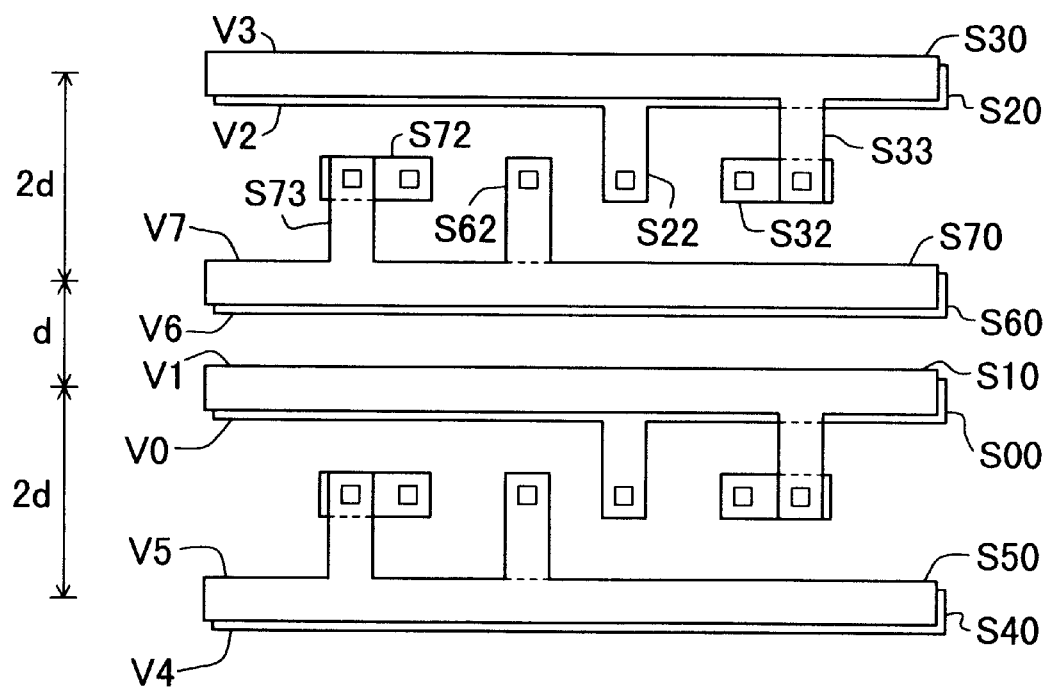
FIG. 10 is a plan view showing a layout pattern of gradation-potential supply lines of a fifth embodiment according to the present invention.

FIG. 10 shows a layout pattern of gradation-potential supply lines of the fifth embodiment according to the present invention. In FIG. 10, a line in the lower wiring layer is depicted by relatively shifting from the other line in the upper wiring layer so that the line in the lower wiring layer can be visible.

A basic pattern in regard to adjacent two upper/lower trunk line pairs in FIG. 10, that is, a pair of the upper/lower trunk lines S30 and S20, a pair of the upper/lower trunk lines S70 and S60, and lines connected thereto are analogous to those of FIG. 8(A). Since interconnection in the first wiring layer is higher in degree of freedom and less in restriction than those of interconnections of the second, the first layer interconnection is not shown in FIG. 10. The basic pattern is repeatedly arranged with 3d pitches in a direction perpendicular to the trunk lines. FIG. 8(A) employs two families of gradation-potential supply lines, but FIG. 10 employs a single family thereof.

As in the prior art, when only the second layer trunk lines are arranged in parallel with a pitch of d, or when the second and third trunk lines are uniformly arranged in parallel with a pitch of 2d, only 6 levels of gradation potentials can be provided to selectors in the same interconnecting region of FIG. 10. However, in FIG. 10, as many as 8 levels of gradation potentials can be provided. In other words, an area for interconnection can be reduced compared with that in the prior art.

Six Embodiment

Figure 11:
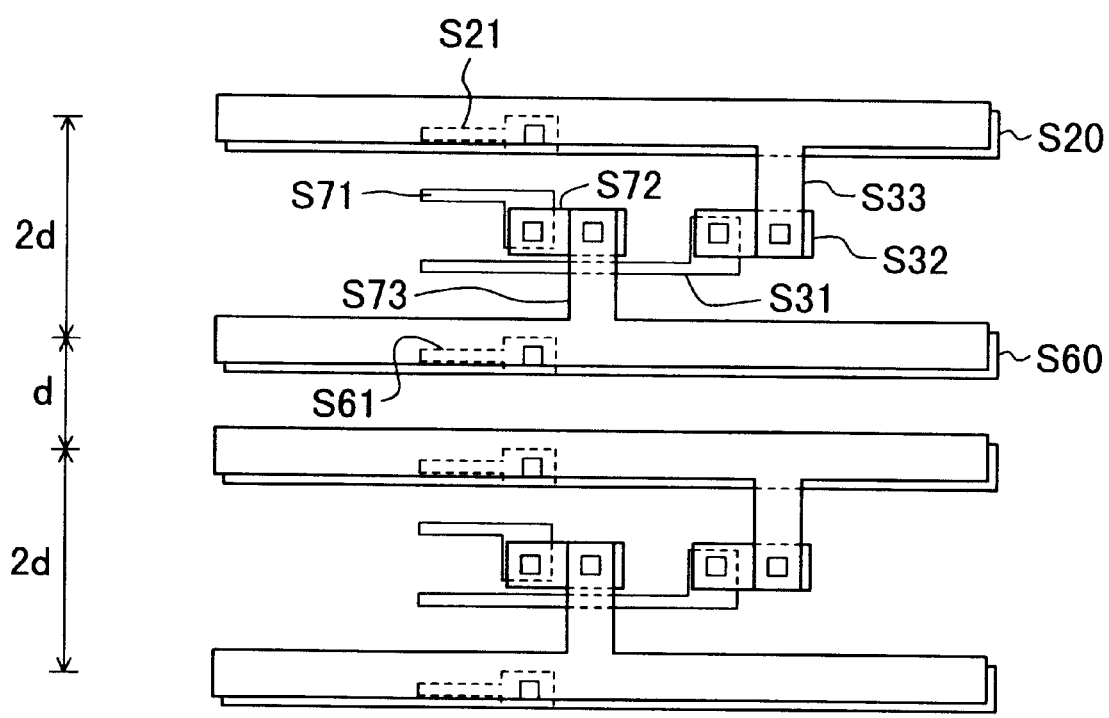
FIG. 11 is a plan view showing a layout pattern of gradation-potential supply lines of a sixth embodiment according to the present invention.

FIG. 11 shows a layout pattern of gradation-potential supply lines of a sixth embodiment according to the present invention.

When gradation-potential supply lines are arranged to be adjacent upper and lower in the third and second wiring layers, the gradation-potential supply trunk line in the third wiring layer cannot be directly connected to an under line in the second wiring layer, but the second gradation-potential supply trunk line can be directly connected to an under line in the first wiring layer. In FIG. 10, the lines S22 and S62 are branched between the trunk lines 20 and S60 in the second wiring layer, whereas, in FIG. 11, the trunk line 20 and S60 are respectively connected through respective interlayer contacts to lines S21 and S61 that are arranged in parallel to the trunk lines 20 and S60. Further, lines S32 and S72 are respectively connected through interlayer contacts to lines S31 and S71 in the lower wiring layer. These lines S21, S71, S31 and S61 are arranged in parallel to one another with equal distance. The first layer interconnecting lines each have a smaller width than that in the upper wiring layers in order to shorten a distance between two adjacent lines.

According to the sixth embodiment, for the prior art selectors shown in FIGS. 18, 19(A) and 19(B), gradation potentials can be provided using wiring area smaller than that in the prior art. In other words, patterns of the hatched portions in FIG. 19(A) can be contracted in the direction perpendicular to the gradation-potential supply lines, whereby a chip area can be reduced.

Seventh Embodiment

Figure 12:
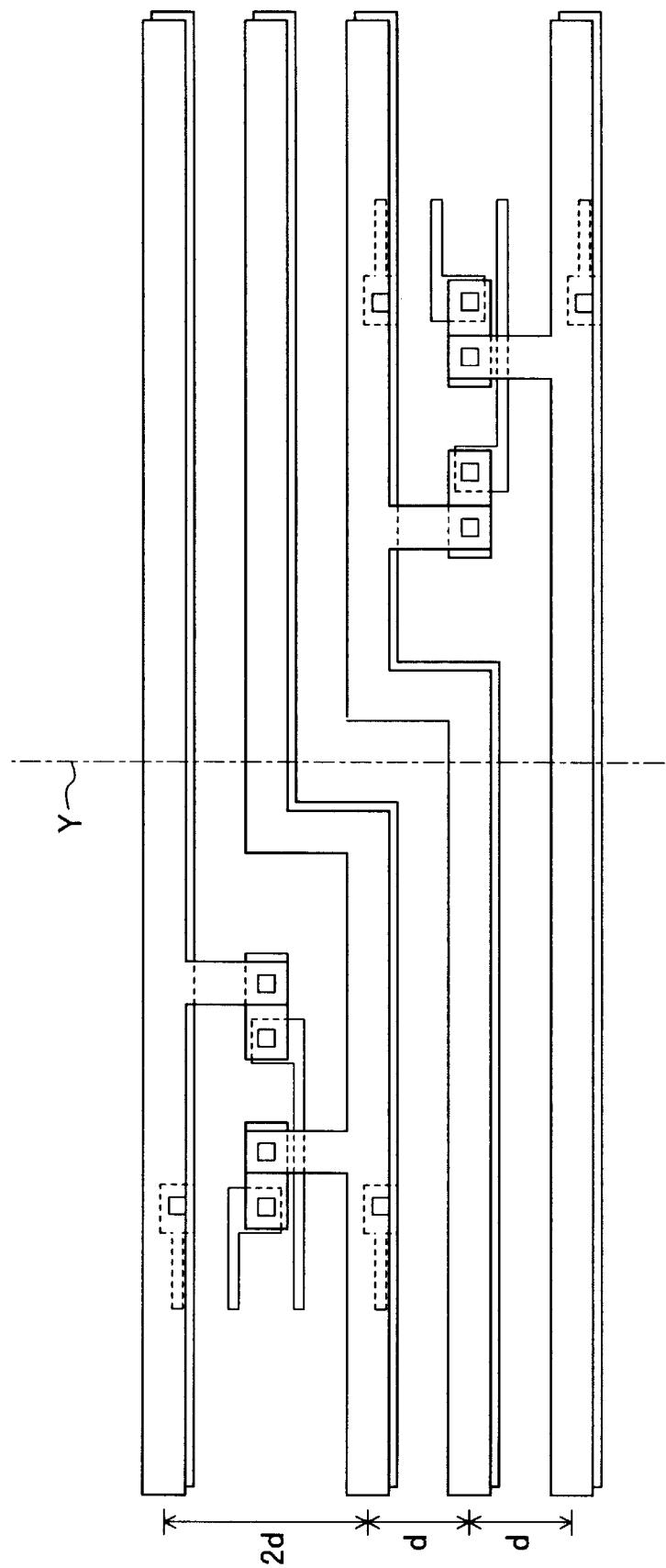
FIG. 12 is a plan view showing a layout pattern of gradation-potential supply lines of a seventh embodiment according to the present invention.

FIG. 12 shows a layout pattern of gradation-potential supply lines of a seventh embodiment according to the present invention.

This pattern is obtained by rearranging the pattern of FIG. 11 so that a connection section and a non-connection section are adjacent to each other as in FIG. 7. In FIG. 12, the pattern of a right half is obtained firstly by symmetric conversion of the pattern of a left half with respect to a line Y, and secondly by shifting the converted pattern in the direction of the line Y which is perpendicular to the direction of the gradation-potential supply lines.

In FIG. 12, when each of the gradation-potential trunk lines is made to run straight with no shifting near the straight line Y and the design rule described above is complied, a wiring region width in a direction perpendicular to the trunk lines amounts to 5d, whereas according to the seventh embodiment, the width is reduced to 4d, so that reduction in occupied wiring area is achieved.

Eighth Embodiment

Figure 13:
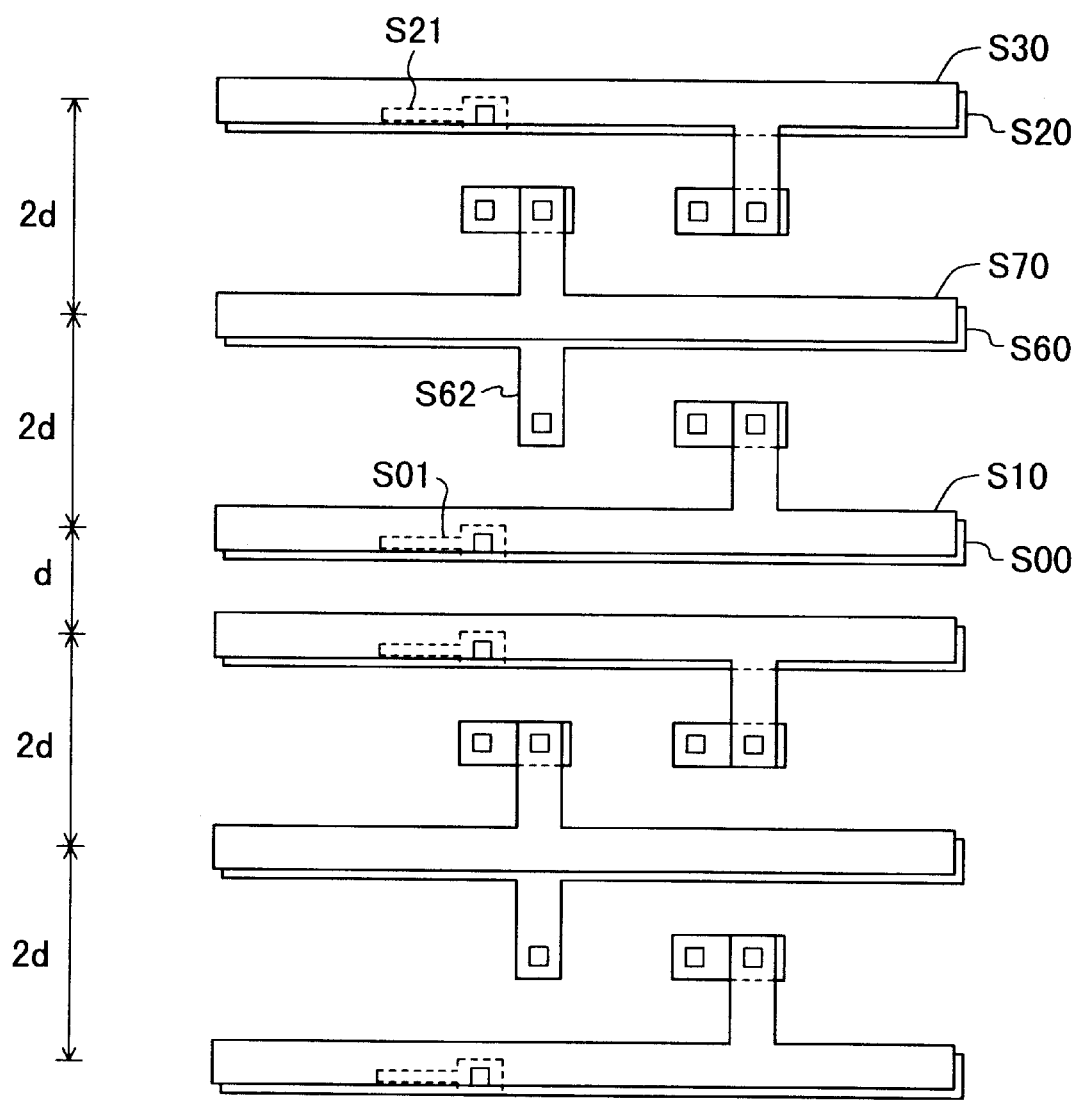
FIG. 13 is a plan view showing a layout pattern of gradation-potential supply lines of a eighth embodiment according to the present invention.

FIG. 13 shows a layout pattern of gradation potential lines of an eighth embodiment according to the present invention.

In FIG. 10, the distance between two adjacent trunk lines is 2d and there are branches between the trunk lines, whereas in FIG. 13, a case is shown in which pitches of the three trunk line pairs adjacent to one another are 2d and there are branches between them. A trunk line S70 has a branch line directed toward a trunk line S30 and a trunk line S60 has a branch line directed toward a trunk line S00. A pattern including the trunk lines S10 and S00 and the lines connected thereto and a pattern including the trunk lines S30 and S20 and the lines connected thereto are symmetric to each other with respect to the trunk lines S70 and S60. The basic pattern comprising the three upper/lower line pairs is repeatedly arranged with 5d pitches in a direction perpendicular to the trunk lines.

As in the prior art, when only the second layer trunk lines are arranged in parallel with a pitch of d, or when the second and third trunk lines are uniformly arranged in parallel with a pitch of 2d, only 10 levels of gradation potentials can be provided to selectors in the same interconnecting region of FIG. 13. However, in FIG. 13, as many as 12 levels of gradation potentials can be provided. In other words, wiring area can be reduced compared with that in the prior art.

When only second layer lines are arranged in parallel to one another as in a prior art case, or when second and third layer lines are in parallel to one another at a uniform 2d pitch in the respective wiring layers, only 10 gradation potentials can be provided to selectors in the same interconnecting area as that of FIG. 13. However, in FIG. 13, 12 levels of gradation potentials can be provided. In other words, wiring area can be smaller than that in a prior art case.

Ninth Embodiment

Figure 14:
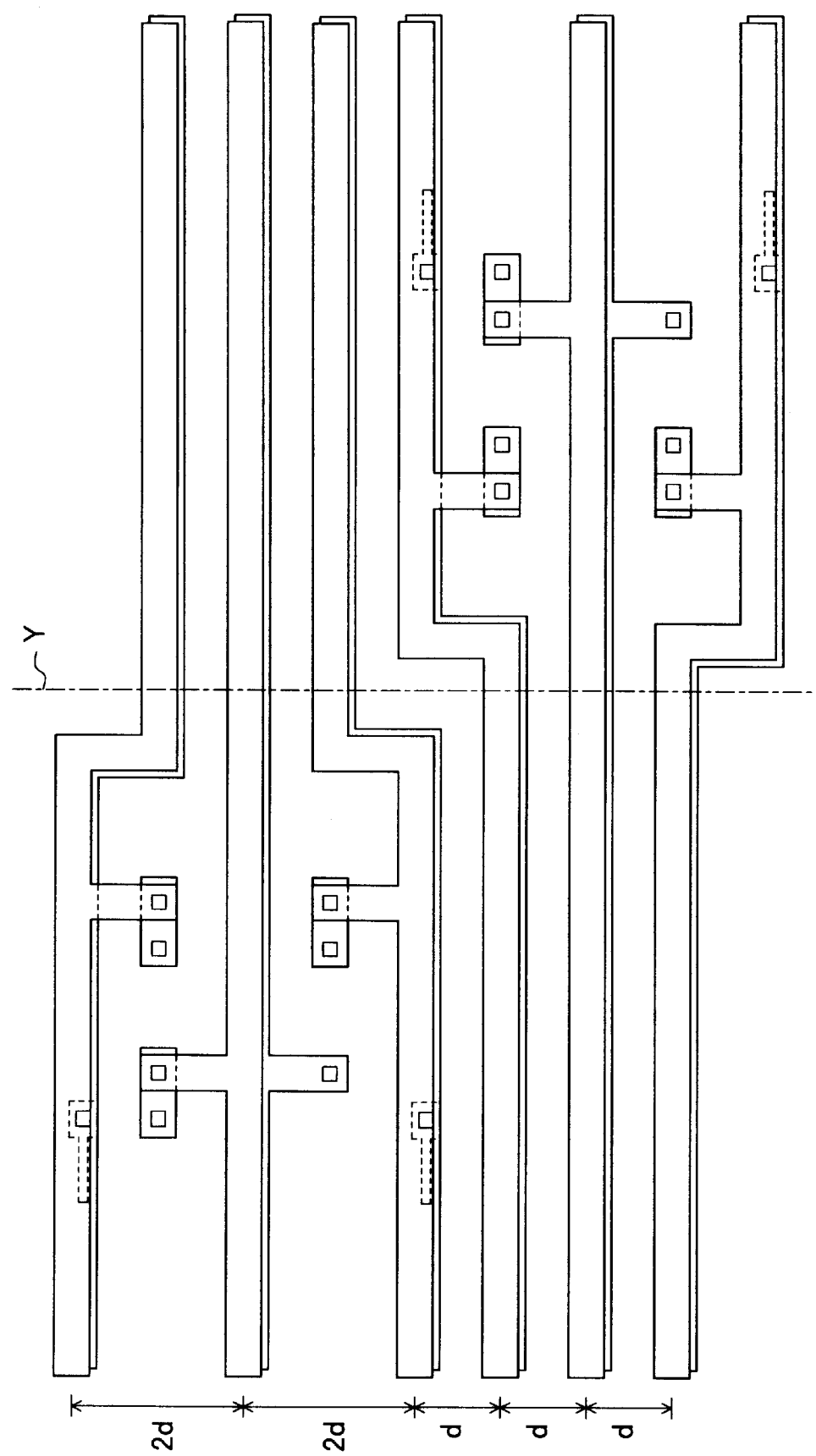
FIG. 14 is a plan view showing a layout pattern of gradation-potential supply lines of a ninth embodiment according to the present invention.

FIG. 14 shows a layout pattern of gradation potential lines of a ninth embodiment according to the present invention.

This pattern is obtained by rearranging the pattern of FIG. 13 so that a connection section and a non-connection section are adjacent to each other as in FIG. 7. In FIG. 14, the pattern of a right half is obtained firstly by symmetric conversion of the pattern of a left half with respect to a line Y, and secondly by shifting the converted pattern in the direction of the line Y which is perpendicular to the direction of the gradation-potential supply lines.

In FIG. 14, when each of the gradation-potential trunk lines is made to run straight with no shifting near the straight line Y and the design rule described above is complied, a wiring region width in a direction perpendicular to the trunk lines amounts to 9d, whereas according to the seventh embodiment, the width is reduced to 7d, so that reduction in occupied wiring area is achieved.

Tenth Embodiment

Figure 15:
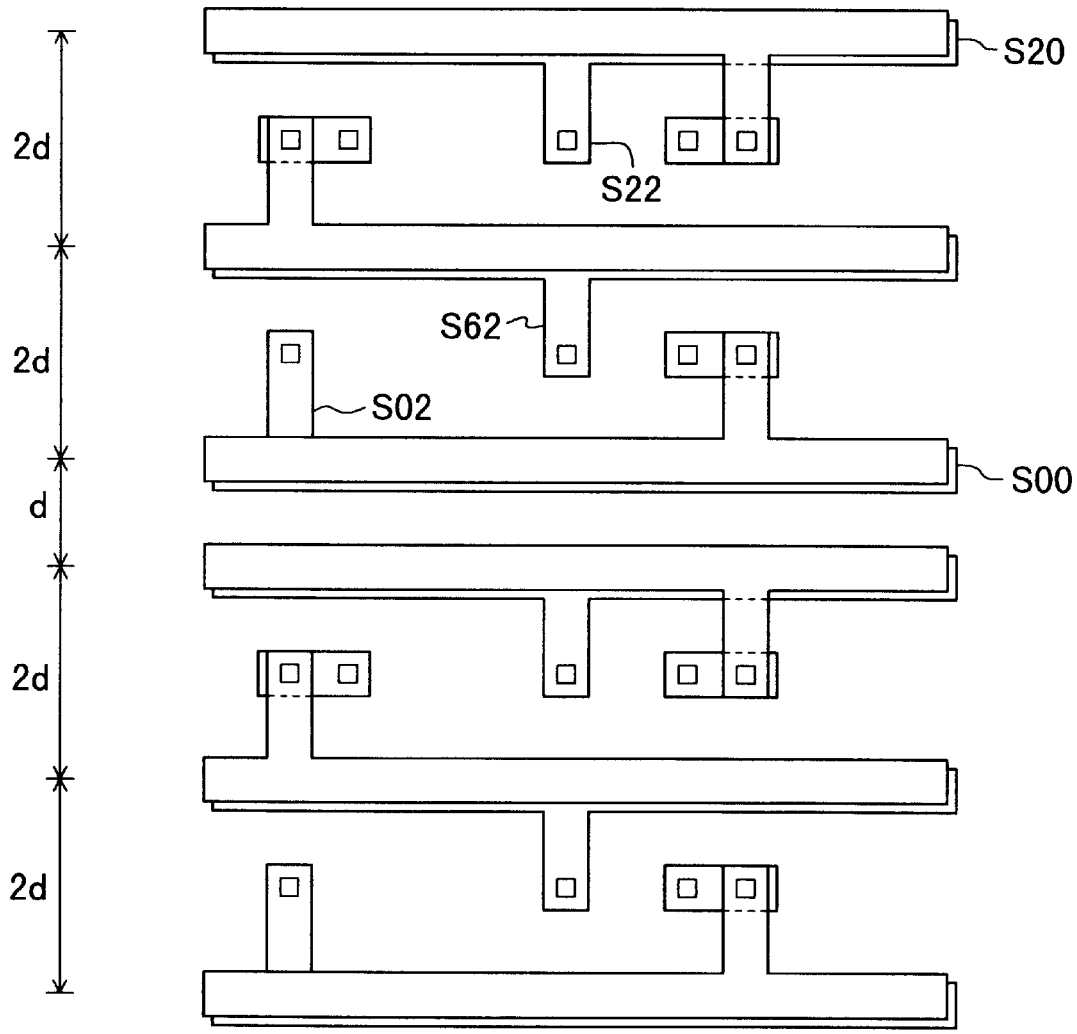
FIG. 15 is a plan view showing a layout pattern of gradation-potential supply lines of a tenth embodiment according to the present invention.

FIG. 15 shows a layout pattern of gradation-potential supply lines of a tenth embodiment according to the present invention. In FIG. 13, the trunk lines S20 and S00 are respectively connected through interlayer contacts to the lines S21 and S01 disposed in parallel to and directly under the respective trunk line S20 and S00. However lines can be branched from the trunk lines S20 and S00 toward the trunk line 60. In FIG. 15, there is shown such a branched case, as the tenth embodiment. The other parts are analogous to FIG. 13 and since the pattern of FIG. 15 can be understand with ease by comparison between both cases, description thereof is omitted here.

When only second layer lines are employed as in the prior art, gradation potentials of only 10 levels are provided, whereas in the case of FIG. 15, gradation potentials of 12 levels can be provided. In other words, wiring area can be smaller than that in the prior art.

Eleventh Embodiment

Figure 16:
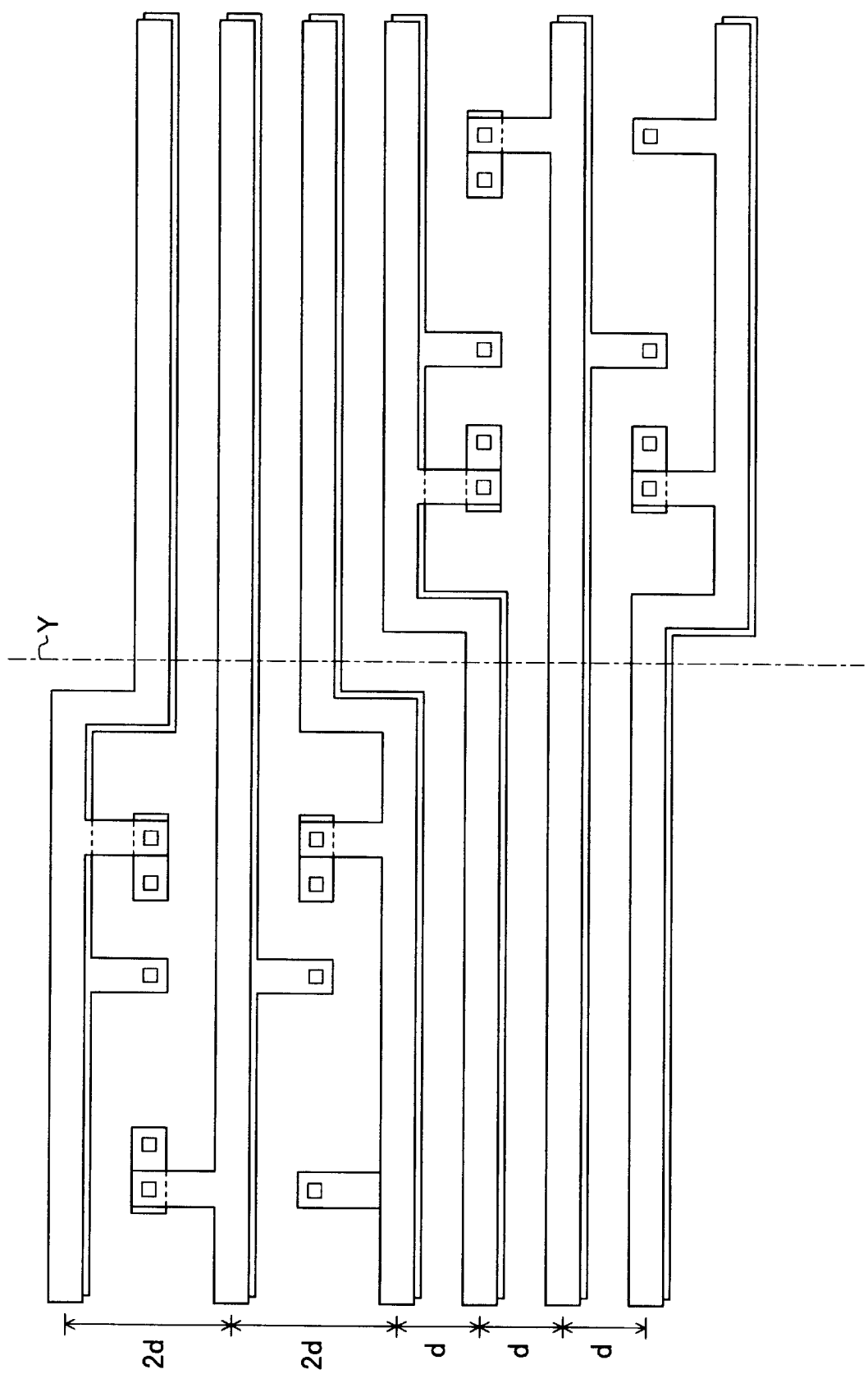
FIG. 16 is a plan view showing a layout pattern of gradation-potential supply lines of a eleventh embodiment according to the present invention.

FIG. 16 shows a layout pattern of gradation-potential supply lines of an eleventh embodiment according to the present invention.

This pattern is obtained by rearranging the pattern of FIG. 15 so that a connection section and a non-connection section are adjacent to each other as in FIG. 7. In FIG. 16, the pattern of a right half is obtained firstly by symmetric conversion of the pattern of a left half with respect to a line Y, and secondly by shifting the converted pattern in the direction of the line Y which is perpendicular to the direction of the gradation-potential supply lines.

In FIG. 16, when each of the gradation-potential trunk lines is made to run straight with no shifting near the straight line Y and the design rule described above is complied, a wiring region width in a direction perpendicular to the trunk lines amounts to 9d, whereas according to the eleventh embodiment, the width is reduced to 7d, so that reduction in occupied wiring area is achieved.

Although preferred embodiments of the present invention has been described, it is to be understood that the invention is not limited thereto and that various changes and modifications may be made without departing from the spirit and scope of the invention.

For example, a signal that is selected by a selector may be digital.

Further, a switching transistor may be a P channel FET or a thin film transistor (TFT).

In FIG. 1, a case may be adopted where switching transistors that are driven by signals *D2, *D1 and *D0 are PMOS transistors and the other transistors are NMOS transistors. In this case, although a chip area is increased compared with the case where MOS transistors of the same-type are employed, the number of selection signal lines are reduced in half since signals D2, D1 and D0 can substitute for the signals *D2, *D1 and *D0.

Besides, a configuration may be adopted in which switching transistors along a gate line G2 are replaced with switching transistors along a gate line *G2. Likewise, configurations may be adopted in which switching transistors along any two of gate lines G1, *G1, G0 and *G0 are interchanged with each other, or switching transistors of any two rows that are arbitrarily selected are interchanged with each other. According to one of these interchanges, potentials provided to gradation-potential supply lines are changed.

Although on-chip wiring has been described in the above described embodiments, the present invention can also be applied in a case where a data driver is constituted of TFTs on a glass substrate of like a liquid crystal display panel. In this case, a semiconductor device according to the present invention is built in the display panel.

Furthermore, the present invention features a pattern in which a plurality of the same circuits are in row on a substrate and in which lines for providing potentials with a plurality of levels to the circuits are arranged in a congested manner. Hence, the circuits to which the lines are connected are not limited to selectors, and the lines are not limited to gradation-potential supply lines either.

Besides, a display device to which the present invention is applied is not limited to a device in which liquid crystal is employed, since the display device is only required to have a data driver for a matrix display.

What is claimed is:

1. A selector circuit for selectively outputting one of $2^n$ input signals in response to n-bit selection signals, comprising:

$2^{n-1}$ 2-input selectors, each 2-input selector selecting one of two inputs in response to a 1-bit selection signal among said n-bit selection signals, said 1-bit selection signal being a most significant bit of said n-bit selection signals; and a $2^{n-1}$-input selector, for selecting one input signal selected by said $2^{n-1}$ 2-input selectors in response to said n-bit selection signals except said 1-bit selection signal, having an array with $2^{n-1}$ rows by 2 (n−1) columns, having a transistor disposed on a position corresponding to either of a complementary pair of each of said n-bit selection signals except said 1-bit selection signal in each row of said array, each row receiving an output signal of corresponding one of said $2^{n-1}$ input selectors, wherein each of said $2^{n-1}$ 2-input selectors includes:
a first switching transistor being on-off controlled by said 1-bit selection signal, said first switching transistor having an input for receiving one of said two inputs and having an output; and
a second switching transistor being controlled so that its on/off state is reverse from that of said first switching transistor, said second switching transistor having an input for receiving the other of said two inputs and having an output connected to said output of said first switching transistor,
wherein said first and second switching transistor of each 2-input selector are arranged in a row, and said $2^{n-1}$ 2-input selectors are arranged in parallel to one another.

2. A selector circuit according to claim 1,
wherein said 1-bit selection signal includes non-inversion and inversion binary signals, and
wherein said first and second switching transistors are of the same type, and are controlled by said non-inversion and inversion binary signals, respectively.

3. A selector circuit according to claim 2, wherein said $2^{n-1}$-input selector includes $2^{n-1}$ analogue switch circuits, each analogue switch circuit has (n−1) switching transistors connected in series and arranged in a row and has an input and an output, said (n−1) switching transistors are on-off controlled such that only one of said $2^{n-1}$ analogue switch circuits is turned on in response to said n-bit selection signals except said 1-bit selection signal, said $2^{n-1}$ analogue switch circuits are arranged in parallel to one another, said $2^{n-1}$ analogue switch circuits are arranged in the same rows as said $2^{n-1}$ 2-input selectors, respectively, and in each row, said output of said first transistor is connected to said input of said corresponding analogue switch circuit, and said outputs of said $2^{n-1}$ analogue switch circuits are commonly connected.

4. A selector circuit according to claim 3,
wherein each of said n-bit selection signals includes a non-inversion binary signal and an inversion binary signal,
wherein switching transistors of said $2^{n-1}$-input selector are of the same type, and
wherein switching transistors of said selector circuit controlled by the same binary signal are arranged in the same column.

5. A selector circuit according to claim 2,
wherein said $2^{n-1}$-input selector comprises a plurality of 2-input selectors arranged in a tree structure to select inputs thereof in tournament selection.

6. A selector circuit according to claim 5,
wherein each bit selection signal of said n-bit selection signals includes a non-inversion binary signal and an inversion binary signal,
wherein switching transistors of said $2^{n-1}$-input selector are of the same type, and
wherein switching transistors of said selector circuit controlled by the same binary signal are arranged in the same column.

7. A selector circuit according to claim 1, wherein each of said switching transistors is an FET.

8. A semiconductor device comprising a selector circuit for selectively outputting one of $2^n$ input signals in response to n-bit selection signals, said selector circuit comprising:

$2^{n-1}$ 2-input selectors, each 2-input selector selecting one of two inputs in response to a 1-bit selection signal among said n-bit selection signals, said 1-bit selection signal being a most significant bit of said n-bit selection signals; and a $2^{n-1}$-input selector for selecting one input signal selected by said $2^{n-1}$ 2-input selectors in response to said n-bit selection signals except said 1-bit selection signal, having an array with $2^{n-1}$ rows by 2 (n−1) columns, having a transistor disposed on a position corresponding to either of a complementary pair of each of said n-bit selection signals except said 1-bit selection signal in each row of said array, each row receiving an output signal of corresponding one of said $2^{n-1}$ input selectors, wherein each of said $2^{n-1}$ 2-input selectors includes:
a first switching transistor being on-off controlled by said 1-bit selection signal, said first switching transistor having an input for receiving one of said two inputs and having an output; and
a second switching transistor being controlled so that its on/off state is reverse from that of said first switching transistor, said second switching transistor having an input for receiving the other of said two inputs and having an output connected to said output of said first switching transistor,
wherein said first and second switching transistor of each 2-input selector are arranged in the same row, and said $2^{n-1}$ 2-input selectors are arranged in parallel to one another.

9. A semiconductor device according to claim 8, further comprising:
a reference potential supply circuit for supplying $2^n$ reference potentials as said $2^n$ input signals; and
an output buffer circuit having an input connected to an output of said $2^{n-1}$-input selector,
wherein said selector circuit, said reference potential supply circuit and said output buffer circuit compose a digital-to-analog converter circuit.

10. A liquid crystal display device comprising:
an active matrix liquid crystal display panel having data lines and scanning lines;
a data driver for providing display potentials to said data lines;
a scanning driver for line-sequentially providing scanning pulses to said scanning lines; and
a digital-to-analog converter circuit provided in an output stage of said data driver, including:
a selector circuit for selectively outputting one of $2^n$ input signals in response to n-bit selection signals, said selector circuit having:

$2^{n-1}$ 2-input selectors, each 2-input selector selecting one of two inputs in response to a 1-bit selection signal among said n-bit selection signals, said 1-bit selection signal being a most significant bit of said n-bit selection signals; and a $2^{n-1}$-input selector for selecting one input signal selected by said $2^{n-1}$ 2-input selectors in response to said n-bit selection signals except said 1-bit selection signal, having an array with $2^{n-1}$ rows by 2 (n−1) columns, having a transistor disposed on a position corresponding to either of a complementary pair of each of said n-bit selection signals except said 1-bit selection signal in each row of said array, each row receiving an output signal of corresponding one of said $2^{n-1}$ input selectors, wherein each of said $2^{n-1}$ 2-input selectors includes:
    a first switching transistor being on-off controlled by said 1-bit selection signal, said first switching transistor having an input for receiving one of said two inputs and having an output; and
    a second switching transistor being controlled so that its on/off state is reverse from that of said first switching transistor, said second switching transistor having an input for receiving the other of said two inputs and having an output connected to said output of said first switching transistor, wherein said first and second switching transistor of each 2-input selector are arranged in the same row, and said $2^{n-1}$ 2-input selectors are arranged in parallel to one another, a reference potential supply circuit for supplying $2^n$ reference potentials as said $2^n$ input signals; and an output buffer circuit having an input connected to an output of said $2^{n-1}$-input selector.

* * * * *